(12) United States Patent
Hamann et al.

(10) Patent No.: US 12,426,187 B2
(45) Date of Patent: Sep. 23, 2025

(54) ADDITIVELY MANUFACTURED DEVICE ENCLOSURES

(71) Applicant: Apple Inc., Cupertino, CA (US)

(72) Inventors: Eric W. Hamann, Santa Clara, CA (US); Abhijeet Misra, Sunnyvale, CA (US); Anthony D. Prescenzi, Half Moon Bay, CA (US); Brian M. Gable, Los Gatos, CA (US); Christopher D. Prest, San Francisco, CA (US); Hoishun Li, San Jose, CA (US); James A. Yurko, Saratoga, CA (US); Lee E. Hooton, Massapequa, NY (US); Michael B. Wittenberg, San Francisco, CA (US); Richard H. Dinh, Saratoga, CA (US); Jennifer D. Schuler, Mountain View, CA (US)

(73) Assignee: APPLE INC., Cupertino, CA (US)

( * ) Notice: Subject to any disclaimer, the term of this patent is extended or adjusted under 35 U.S.C. 154(b) by 450 days.

(21) Appl. No.: 17/805,641

(22) Filed: Jun. 6, 2022

(65) Prior Publication Data

US 2022/0304175 A1    Sep. 22, 2022

Related U.S. Application Data

(63) Continuation-in-part of application No. 17/448,198, filed on Sep. 20, 2021, which is a continuation of application No. 17/138,347, filed on Dec. 30, 2020, now abandoned.

(60) Provisional application No. 63/208,194, filed on Jun. 8, 2021, provisional application No. 63/027,930, filed on May 20, 2020.

(51) Int. Cl.
*H05K 5/04* (2006.01)
*H05K 5/00* (2025.01)
*H05K 5/02* (2006.01)
*H04M 1/02* (2006.01)

(52) U.S. Cl.
CPC ............ *H05K 5/04* (2013.01); *H05K 5/0086* (2013.01); *H05K 5/0208* (2013.01); *H04M 1/026* (2013.01)

(58) Field of Classification Search
CPC ...................................................... H05K 5/04
USPC ........................................................ 428/615
See application file for complete search history.

(56) References Cited

U.S. PATENT DOCUMENTS

| 2012/0250250 | A1* | 10/2012 | Tatebe | G06F 1/1656 361/679.01 |
| 2018/0017995 | A1* | 1/2018 | Gable | H04M 1/0249 |
| 2020/0205307 | A1 | 6/2020 | Hooton et al. | |

FOREIGN PATENT DOCUMENTS

| CN | 107592384 A | 1/2018 |
| CN | 111491055 A | 8/2020 |

* cited by examiner

*Primary Examiner* — Katherine A Christy
(74) *Attorney, Agent, or Firm* — Dorsey & Whitney LLP

(57) ABSTRACT

A component for an electronic device can include a pre-formed substrate comprising a first metal and an additively manufactured portion bonded to the pre-formed substrate. The additively manufactured portion can include a first portion comprising a second metal and defining a volume, the first portion having a first value of a material property, and a second portion disposed in the volume, the second portion having a second value of the material property that is different from the first value.

16 Claims, 15 Drawing Sheets

ADDITIVELY MANUFACTURED DEVICE ENCLOSURES

CROSS-REFERENCE TO RELATED APPLICATION(S)

This application claims the benefit of priority to U.S. Provisional Patent Application No. 63/208,194, filed 8 Jun. 2021, and entitled "ADDITIVELY MANUFACTURED DEVICE ENCLOSURES," and is a continuation-in-part of U.S. Patent Application 17/448,198, filed 20 Sep. 2021, which application is a continuation of U.S. patent application Ser. No. 17/138,347, filed 30 Dec. 2020, and entitled "COMPOSITE ELECTRONIC DEVICE COMPONENTS," which claims priority to U.S. Provisional Application No. 63/027,930, filed 20 May 2020, and is a continuation-in-part of U.S. patent application Ser. No. 16/449,061, filed 21 Jun. 2019, and entitled "CORE SHELL WITH VARIOUS FILLER MATERIALS FOR ENHANCED THERMAL CONDUCTIVITY," and U.S. patent application Ser. No. 16/417,590, filed 20 May 2019, and entitled "DEVICE ENCLOSURE," now U.S. Pat. No. 10,849,246, issued 24 Nov. 2020, the entire disclosures of which are hereby incorporated by reference.

FIELD

The described embodiments relate generally to electronic devices. More particularly, the present embodiments relate to enclosures for electronic devices.

BACKGROUND

Electronic devices are widespread in society and can take a variety of forms, from wristwatches to computers. Electronic devices, including portable electronic devices such as handheld phones, tablet computers, and watches, can experience contact with various surfaces during use. Further, use, transportation, and storage of such devices can exert mechanical and thermal stresses thereon.

Components for these devices, such as enclosures or housings, can benefit from exhibiting different combinations of properties relating to the use of the device. A housing for a portable electronic device can have a combination of properties, such as strength, appearance, toughness, abrasion resistance, weight, corrosion resistance, thermal conductivity, electromagnetic shielding, and cost, in order for the device to function as desired. Certain materials, or certain methods of forming materials can provide a desired level of performance with respect to some properties, but may not provide an optimal level of performance with respect to others. Accordingly, it may be desirable to provide a device enclosure that can include multiple materials, or material formed by multiple processes, to achieve a desired level of performance with respect to as many properties as desired.

SUMMARY

According to some aspects, a housing for an electronic device can include a first housing portion, including a first pre-formed substrate including a first metal and at least partially defining a cosmetic exterior surface of the housing, a first additively manufactured portion bonded to the first pre-formed substrate, the first additively manufactured portion including a second metal and defining a first engagement structure, a second housing portion, including a second pre-formed substrate including the first metal and at least partially defining the cosmetic exterior surface, a second additively manufactured portion bonded to the second pre-formed metallic substrate, the second additively manufactured portion including the second metal and defining a second engagement structure, and a moldable material mechanically engaging the first engagement structure and the second engagement structure to join the first housing portion to the second housing portion.

In some examples, the first metal is different from the second metal. The first metal includes at least one of steel or titanium. The second metal includes at least one of steel, aluminum, or copper. The first pre-formed substrate and the second pre-formed substrate have a first density, and the first additively manufactured portion and the second additively manufactured portion have a second density lower than the first density. At least one of the first engagement structure or the second engagement structure is a gyroid structure. At least one of the first engagement structure or the second engagement structure is an array of voids in fluid communication with one another, or a fluidly interconnected void structure. The moldable material includes a polymer.

According to some aspects, a component for an electronic device can include a pre-formed substrate including a first metal, an additively manufactured portion bonded to the pre-formed substrate, the additively manufactured portion including a first portion including a second metal and defining a volume, the first portion having a first value of a material property, and a second portion disposed in the volume, the second portion having a second value of the material property that is different from the first value.

In some examples, the material property is density and the second value is lower than the first value. The material property is thermal conductivity and the second value is higher than the first value. The second portion includes an electronic component. The second portion includes a self-healing material. The first metal is different from the second metal. The pre-formed substrate defines a cosmetic exterior surface of the electronic device. The additively manufactured portion is diffusion bonded to the pre-formed substrate.

According to some aspects, a method of forming a component for an electronic device can include 3D printing a first material onto a first pre-formed substrate including a second material to form a first part, the first part defining a first engagement structure, 3D printing the first material onto a second pre-formed substrate including the second material to form a second part, the second part defining a second engagement structure, and providing a moldable material into the first engagement structure and the second engagement structure to join the first part and the second part.

In some examples, the method can further include solidifying the moldable material. The first material and the second material include metal. The moldable material electrically insulates the first part from the second part.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
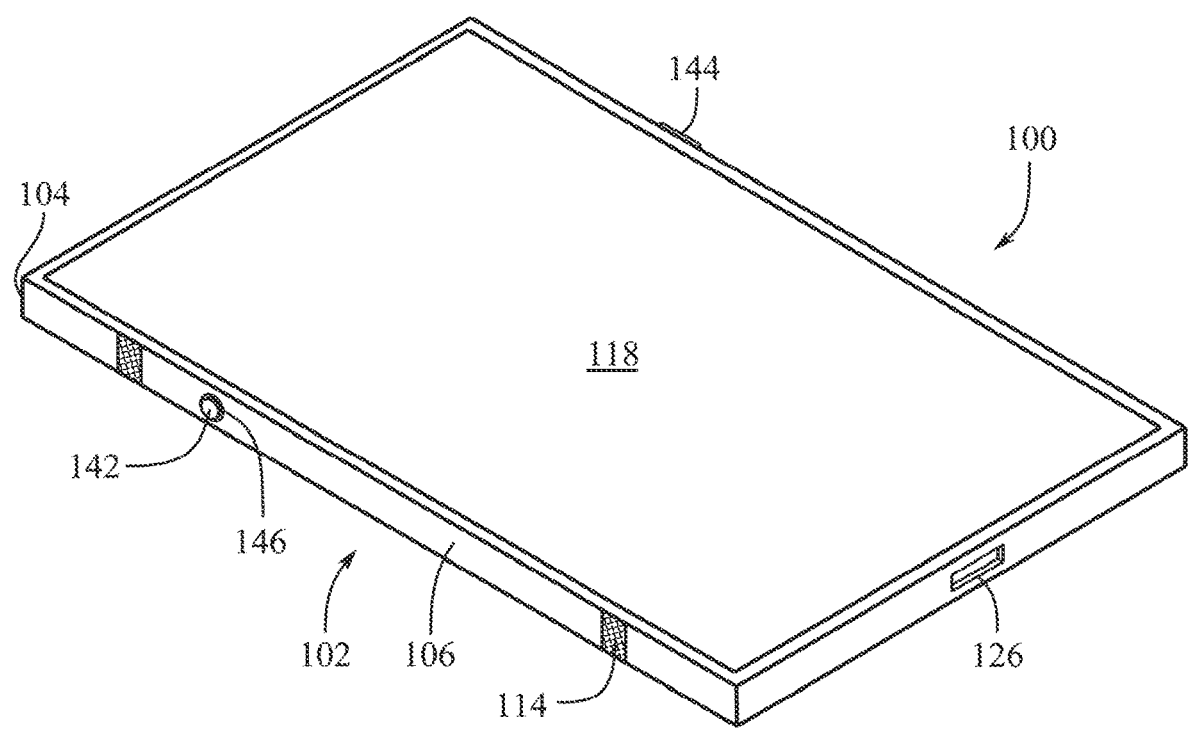
FIG. 1A shows a perspective view of an electronic device.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

One aspect of the present disclosure relates to components for electronic devices, such as frames, housings, bands, or portions thereof for an electronic device that are at least partially formed through additive manufacturing processes, such as 3D printing. In some examples, a housing for an electronic device can include a pre-formed exterior or outer portion, also referred to as a shell or substrate, having a first set of material properties. The pre-formed exterior portion can include a metallic material, such as stainless steel. The housing or component can also include an interior or inner portion, also referred to as a core or additively manufactured portion that is deposited or formed on the pre-formed substrate and that is bonded thereto. By additively forming the interior portion, for example, through 3D printing techniques such as powder bed processes (such as selective laser melting, electron beam melting, direct metal laser sintering, and/or laser metal fusion), deposition processes (such as laser deposition welding, metal powder application, direct energy deposition, direct metal deposition, and/or laser cladding), and/or any other additive manufacturing processes or combinations thereof, the inner portion can have second, different values than the material properties of the exterior portion, such as different densities and/or thermal conductivities, or can have a second, different set of material properties that are independent of the first set of material properties. For example, the interior portion can include a metallic material such as aluminum. The pre-formed exterior portion and the interior portion can be welded, fused, bonded, adhered, or otherwise joined together such that they form the component, or a portion thereof, and act as a substantially unitary body. As used herein, the term bonded can refer to any form of secure joining, including a direct bond, a bond through an adhesive or other material, a diffusion bond, a mechanical bond, a metallic bond, or any other form of joinder. In some examples, a mechanical, metallurgical, other type of bond, or combinations thereof, joins the exterior and interior portions. That is, in some examples, the component can be treated as a single piece or body of material with respect to various processes, such as the manufacturing and assembly processes described herein.

In some examples, a component, such as a housing component, can include an exterior portion including a first material, such as a first metal, and an interior portion bonded to the exterior portion. The interior portion can be additively manufactured or formed and can include a second material different from the first material, such as a second metal that is different from the first metal. As used herein with respect to two materials, such as two metals, the term different can be used to refer to a first material that has at least one material property that is not identical in either value or degree to the same material property of the second material. For example, two aluminum alloys can be considered different metals because although they both include aluminum, one alloy can have a thermal conductivity that is not identical to the thermal conductivity of the other alloy. In some examples, to be considered different materials, at least one material property of the materials must differ by at least about 0.001%, about 0.01%, about 0.1%, about 1%, or about 10%, or more.

In some examples, the formation of a component by additive manufacturing processes can allow for the decoupling of the material properties of the interior, primarily structural or functional portion of the housing, from the exterior, primarily cosmetic portion of the housing. The components and methods for forming the same described herein can also allow for the controlled variation of one or more properties of the additively manufactured material including the interior portion. That is, the material of the inner portion can be selected to exhibit one or more properties of the housing while the material of the exterior portion can be independently selected to exhibit one or more other desired properties of the housing, and the material of the inner portion can be deposited or formed in such a way that one or more properties, and/or the structure of the inner portion can vary as desired.

For example, the material, properties, and/or geometry of the inner portion can be selected to achieve a desired level of density, strength, weight, stiffness, cost, thermal conductivity, electromagnetic transparency, machinability, carbon footprint, recyclability, other properties, or combinations thereof. Meanwhile, the material and/or geometry of the exterior portion can be independently selected in order to achieve a desired level of density, hardness, corrosion resistance, scratch resistance, cosmetic finish, strength, weight, stiffness, cost, thermal conductivity, electromagnetic transparency, machinability, carbon footprint, recyclability, other properties, or combinations thereof.

Additionally, by additively manufacturing the interior portion, structures can be formed that may not be able to be formed through other techniques, such as machining or extruding. For example, the interior portion can be formed so as to define one or more undercut regions or structures, portions of varying or different density, and/or enclosed or partially enclosed volumes or spaces. In some examples, other materials, or even components can be positioned or disposed in a cavity or volume at least partially defined by the interior portion. For example, a lighter or less dense material can be positioned in the volume to save weight. In some examples, a self-healing material can be positioned in the volume in order to repair or prevent the spread of any cracks or fissures that may form in the interior or exterior portion during high stress events. In some examples, components such as antennas, wires, and/or circuits can be positioned in the volume in order to allow for more space within the electronic device and/or to allow for a reduced size of the device. In some examples, at least some of the interior portion can define an engagement structure or engagement feature that can be used to join the component to one or more other components of the device. For example, a moldable material can be provided to the engagement structure defined by the interior portion and can be solidified to form a mechanical bond therewith in order to securely retain the component to the moldable material. Multiple components can thus be joined by a single portion of moldable material in this way.

In some examples, the interior or inner portion of the component can include any material that has a desired material property or properties, and can be additively deposited or formed on the pre-formed substrate that makes up the exterior portion, as described herein. For example, the interior portion of the component can include polymeric materials, ceramic materials, metallic materials, or combinations thereof. In some examples, the interior portion of a component, as described herein, can include a metallic material such as aluminum, copper, steel, or alloys, or combinations thereof. In some examples, the interior portion can include a metallic material having a foamed structure or a bulk metallic glass. In some examples, the interior portion can include a metallic material having an ordered structure, such as a gyroid structure or other structure including an array or network of negative spaces.

In some examples, the exterior or outer portion of the housing or component can include any material that has a desired material property or properties, and can be bonded to and support an interior portion, as described herein. For example, the exterior portion can include polymeric materials, ceramic materials, metallic materials, or combinations thereof. In some examples, the exterior portion of a component, as described herein, can include a metallic material such as steel, titanium, aluminum, or alloys, or combinations thereof. In other examples, the exterior portion can include precious or semi-precious metals such as silver, gold, platinum, or alloys, or combinations thereof. In yet additional examples, the exterior portion can include ceramic materials, such as alumina or sapphire, zirconia, carbides, nitrides, borides, oxides, or combinations thereof. In some examples, the exterior portion can include a metallic material such as a bulk metallic glass. In other examples, the exterior portion can itself be a material, such as a carbon reinforced polymer material, ceramic reinforced polymer material, a metal matrix composite material, a ceramic matrix composite material, or other composite materials.

In some examples, the exterior portion of the component can be a pre-formed or standalone substrate or article prior to the deposition or formation of the interior portion to form the component. That is, the material of the exterior portion can be a substantially unitary body, such as a blank, bar, strip, or piece of material. In some examples, the exterior portion is not a coating. That is, in some examples, the exterior portion is not grown, deposited, coated, or otherwise formed on the interior portion.

The exterior portion of the component can have a thickness of greater than about 25 microns, greater than about 50 microns, greater than about 100 microns, 200 microns, 300 microns, 400 microns, 500 microns, or more. In some examples, the exterior portion can have a thickness of up to about 1 millimeter, up to about 2 millimeters, or up to about 5 millimeters or more. Further, the exterior portion can have a thickness that varies along one or more positions of the exterior portion. For example, a feature can be formed in the exterior portion and the thickness adjacent to the feature can be about 1 millimeter or more, while some other areas of the exterior portion, where no feature is present, can have a thickness of about 100 microns. The desired thickness of the exterior portion can be dependent on the material of the exterior portion, the material of the interior portion, the desired properties of the final formed component, and combinations thereof.

Either or both of the interior and exterior portions of the component, such as a portion of a housing of an electronic device, can be subjected to treatment processes prior to, during, or subsequent to the joining process. For example, a surface of the exterior portion of the component can be subjected to a surface treatment, such as a physical vapor deposition process, after the component has been formed.

These and other embodiments are discussed below with reference to FIGS. 1-11. However, those skilled in the art will readily appreciate that the detailed description given herein with respect to these Figures is for explanatory purposes only and should not be construed as limiting. Furthermore, as used herein, a system, a method, an article, a component, a feature, or a sub-feature including at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

FIG. 1A illustrates a perspective view of an embodiment of an electronic device 100. The electronic device 100 shown in FIG. 1 is a mobile wireless communication device (a smartphone, for example). The smartphone of FIG. 1 is merely one representative example of a device that can be used in conjunction with the systems and methods disclosed herein. Electronic device 100 can correspond to any form of wearable electronic device, a portable media player, a media storage device, a portable digital assistant ("PDA"), a tablet computer, a computer, a mobile communication device, a GPS unit, a remote control device, or other electronic device. The electronic device 100 can be referred to as an electronic device or a consumer device.

The electronic device 100 can have a housing or an enclosure that includes a band or a frame 102 that defines an outer perimeter of the electronic device 100. The band 102, or portions thereof, can be or can include a metallic component, as described herein. In some examples, the band 102 can include several sidewall components, such as a first sidewall component 104 and a second sidewall component 106. The aforementioned sidewall components can be or can include a component including an additively manufactured portion, as described herein.

In some instances, some of the sidewall components form part of an antenna assembly (not shown in FIG. 1). As a result, a non-metal material, or materials, can separate the sidewall components of the band 102 from each other in order to electrically isolate the sidewall components. For example, a separating material 114 separates the first sidewall component 104 from the second sidewall component 106. The aforementioned materials can include a moldable non-metallic material, for example, a polymeric material. In some examples, the non-metallic material can be electrically inert, or insulating, such as plastics and/or resin, as non-limiting examples.

The electronic device 100 can further include a display assembly 6 that can include a transparent protective cover that at least partially defines an exterior surface of the device 100. The display assembly 116 can include multiple layers, with each layer providing a unique function. In some examples, the transparent protective cover can be formed from a transparent material, such as glass, plastic, sapphire, or similar transparent materials. In this regard, the protective cover can be referred to as a transparent cover, a transparent protective cover, or a cover glass (when the protective cover includes glass). The electronic device 100 can further include a port 126 designed to receive a connector of a cable assembly. The port 126 allows the electronic device 100 to communicate data information (send and receive), and also allows the electronic device 100 to receive electrical energy to charge a battery assembly. Accordingly, the port 126 can include terminals that electrically couple to the connector.

The electronic device 100 can include several control inputs designed to provide a command to the electronic device 100. For example, the electronic device 100 can include a control input 144. The aforementioned control input can be used to adjust the visual information presented on the display assembly 116 or the volume of acoustical energy output by an audio module, as non-limiting examples. The control input can include one of a switch, a sensor, or a button designed to generate a command to a processor circuit. The control input can at least partially extend through an opening in the sidewall components. For example, the second sidewall component 106 can include or define an opening 146 that receives another control input 142. Further details of an exemplary electronic device are provided below with reference to FIG. 1B.

Figure 1B:
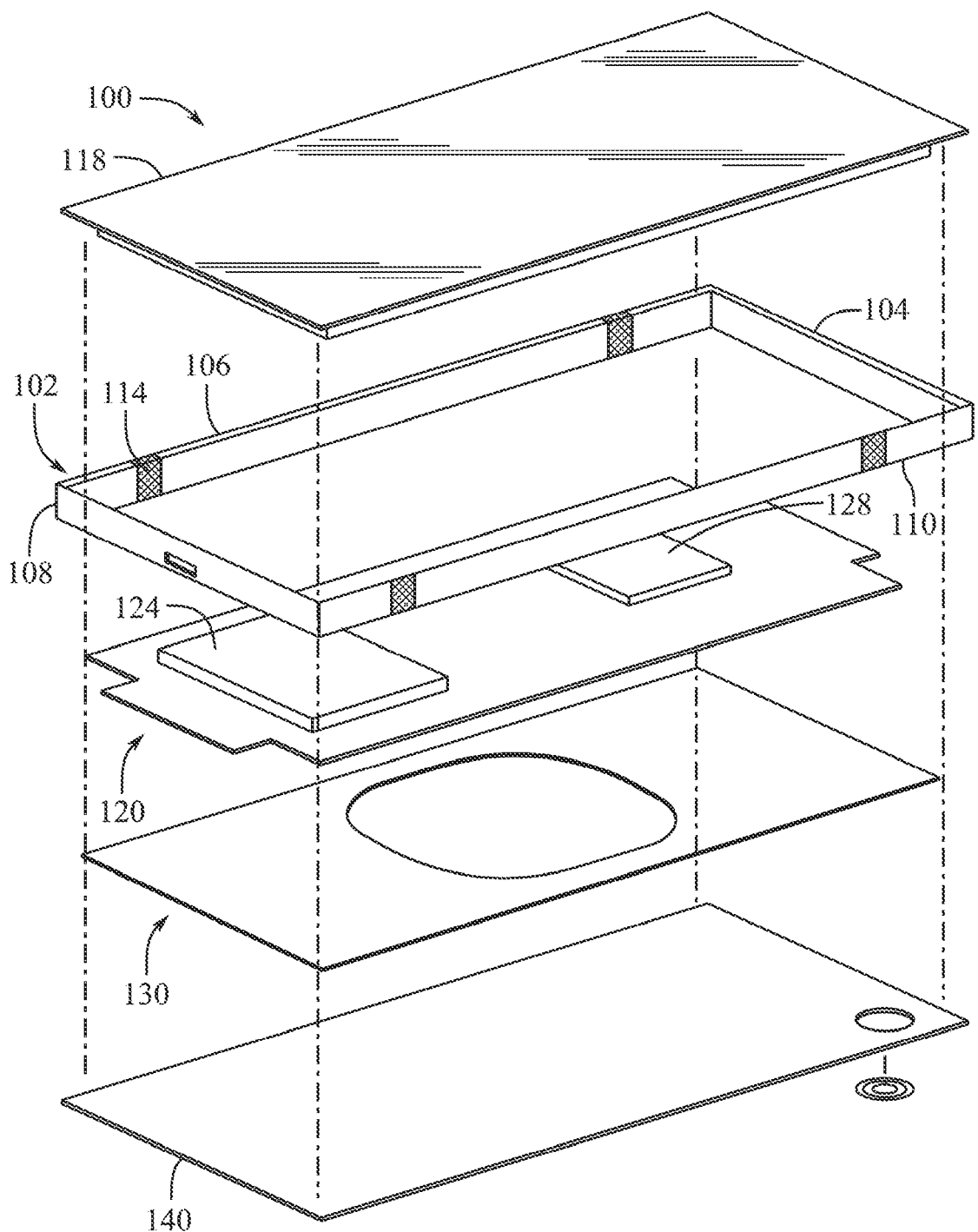
FIG. 1B shows an exploded view of an electronic device.

FIG. 1B illustrates an exploded view of the electronic device 100. The electronic device can have a housing that includes a band 102 that at least partially defines an exterior portion, such as an outer perimeter, of the electronic device. The band 102 can include several sidewall components, such as a first sidewall component 1204, a second sidewall component 106, a third sidewall component 108 (opposite the first sidewall component 104), and a fourth sidewall component 110. The aforementioned sidewall components can be or can include a component including an additively manufactured portion, as described herein. The band 102 can also include a non-metal material or materials that separate and/or join the sidewall components of the band 102 with each other, as described herein. For example, separating material 114 can separate and/or join the second sidewall component 106 with the third sidewall component 108.

The electronic device 100 can include internal components such as processors, memory, circuit boards, batteries, and sensors. Such components can be disposed within an internal volume defined, at least partially, by the band 102, and can be affixed to the band 102, via internal surfaces, attachment features, threaded connectors, studs, posts, and/or other fixing features, that are formed into, defined by, or otherwise part of the band 102.

The device 100 can include internal components, such as a system in package (SiP) 128 including one or more integrated circuits such as a processors, sensors, and memory. The device 100 can also include a battery 124 housed in the internal volume of the device 100. The device 100 can also include one or more sensors, such as optical or other sensors, that can sense or otherwise detect information regarding the environment exterior to the internal volume of the device 100. Additional components, such as a haptic engine, can also be included in the device 100.

The electronic device 100 can further include a chassis 120 that can provide structural support. The chassis 120 can include a rigid material, such as a metal, or can include a composite construction. Also, the chassis 120 can be coupled to the band 102. In this manner, the chassis 120 can also provide an electrical grounding path for components electrically coupled to the chassis. The electronic device can alternatively or additionally include a back plate 130 having cladding layers and/or other attachment features such that one or more components of the electronic device 100 can be attached to the back plate 130, for example, via welding. The back plate 130 can form conductive pathways for connecting components of the electronic device 100. In some cases, the back plate 130 can be attached to the band 102 of the device 100 by one or more attachment features.

An exterior surface of the electronic device 100 can further be defined by a back cover 140 that can be coupled to the band 102. In this regard, the back cover 140 can combine with the band 102 to form an enclosure or housing of the electronic device 100 with the enclosure or housing (including band 102 and back cover 140) at least partially defining an internal volume. The back cover 140 can include a material that is transparent to any desired range of wavelengths of electromagnetic radiation, such as visible light. In some examples, the back cover 140 can include a material that can allow for inducted charging therethrough. In some examples, the back cover 140 can include a material such as glass, plastic, and/or sapphire.

While any number or variety of components of an electronic device, such as electronic device 100, can be formed from or can include an additively manufactured portion, the structure of these components can be, for example, a component including an additively manufactured interior portion bonded to a pre-formed exterior portion, as described herein. The structure and materials of the exterior and interior portion, as well as the component itself, can apply to not only to the specific examples discussed herein, but to any number or variety of embodiments in any combination. Various embodiments of components are described below, with reference to FIGS. 2-3C.

Figure 2:
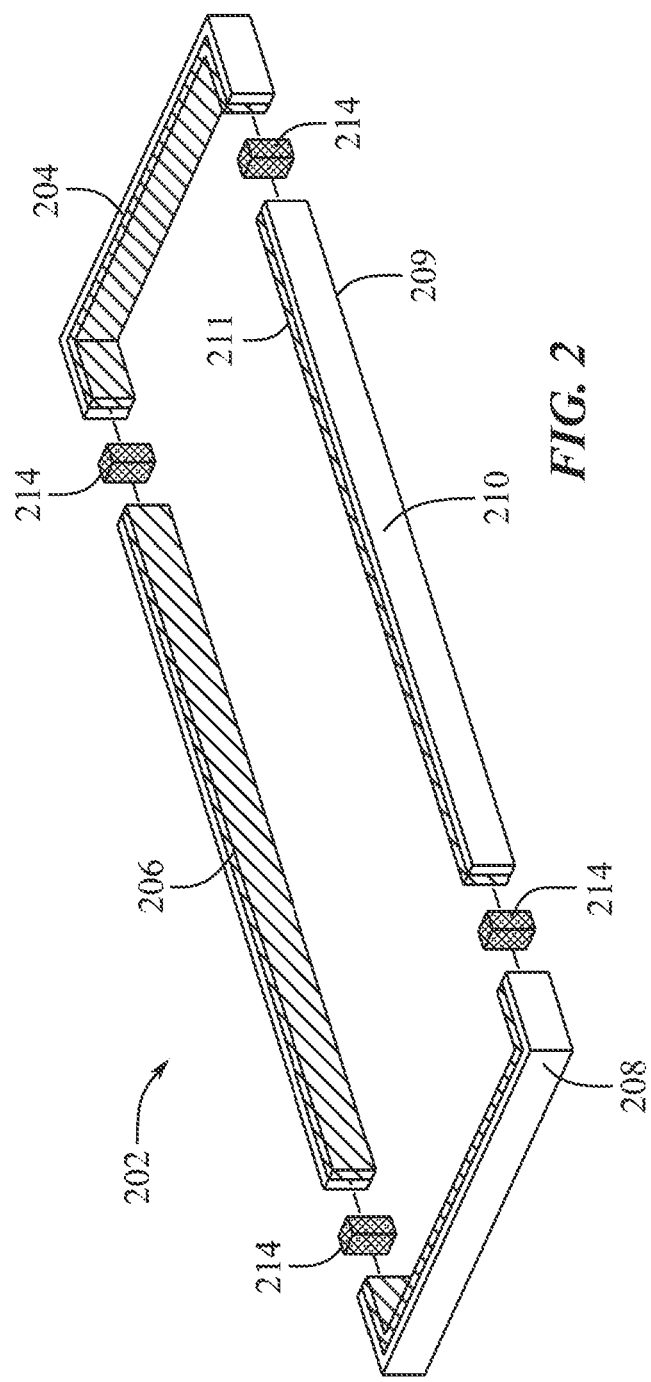
FIG. 2 shows an exploded view of a housing of an electronic device.

As shown in FIG. 2 and in some examples, a housing 202 for an electronic device can include one or more components that include a pre-formed cosmetic exterior portion bonded to an additively manufactured interior portion, as described herein. For example, the band 202 can include a first sidewall component 204, a second sidewall component 206, a third sidewall component 208 (opposite the first sidewall component 204), and a fourth sidewall component 210. In some examples, and as described herein, the components 204, 206, 208, 210 can be separated and/or joined together by portions of a moldable non-metallic material 214 that can penetrate or interlock with engagement structures or features defined by the components 204, 206, 208, 210, such as interlock features defined by the additively manufactured interior portion of the components 204, 206, 208, 210.

As shown in FIG. 2, a sidewall component 210 of the band 202 can include an exterior portion 209 that can be formed from a relatively hard, strong, attractive, and/or durable cosmetic material, such as steel. An interior portion 211 of the sidewall component 210 can include a different material, such as aluminum or an aluminum alloy and can be additively formed or deposited on, and diffusion bonded to, the exterior portion 209. The interior portion 211 can be easily machinable to allow for the low-cost formation of attachment features and can be relatively light weight, with a high thermal conductivity. As described further herein, the additively manufactured interior portion 211 can define an engagement structure that can be bonded to the non-metallic material 214 to provide a high strength bond and structural integrity to the band 202. The band 202 can further include additional sidewall components 204, 206, and 208 that can be separated and/or joined together by portions of moldable non-metallic material 214 as described herein. Further, in some examples, the components including additively manufactured portions can form portions of the housing or enclosure other than the sidewalls, such as a top portion, bottom portion, or any portion of the housing or enclosure. Further details of components are provided below with reference to FIGS. 3A and 3B.

Figure 3A:
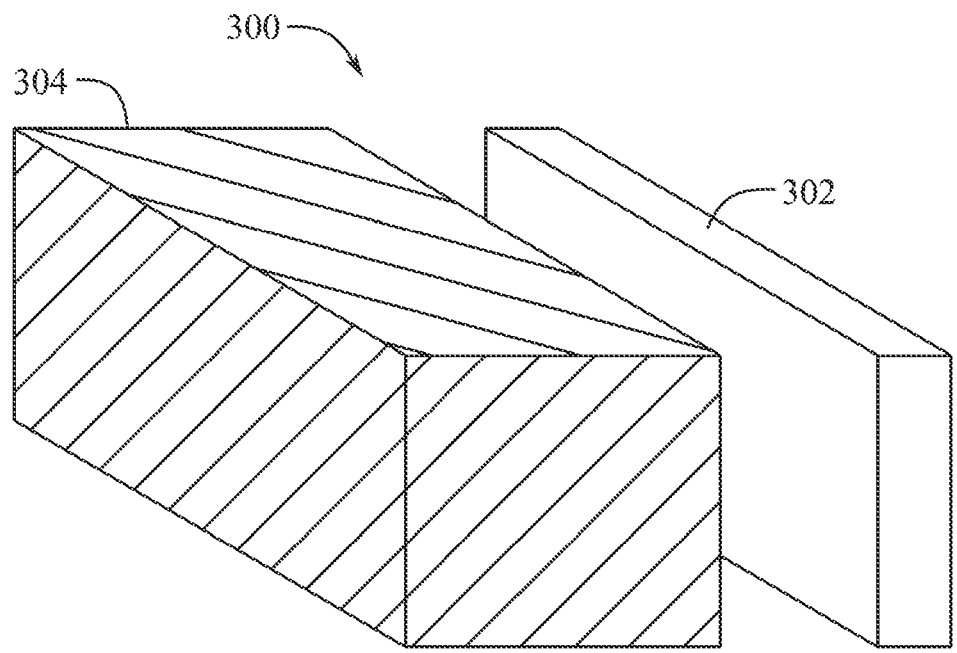
FIG. 3A shows a perspective exploded view of a component of an electronic device.

FIG. 3A shows an exploded perspective view of a component 300 including a cosmetic outer or exterior portion 302 and an additively formed or deposited inner or interior portion 304. Although illustrated in FIG. 3A as an exploded view, the component 300 can include a pre-formed outer or exterior portion 302 that is bonded to the inner or interior portion 304, which can be deposited or formed thereon. In some examples, the exterior portion 302 can be pre-formed and can include a metallic material. In some examples, the metallic material of the exterior portion 302 can include one or more steel alloys, such as a stainless steel alloy. In some examples, the metallic material of the exterior portion 302 can include a 316 series stainless steel alloy, including 316L or 316Li stainless steel. In some examples, the metallic material of the exterior portion 302 can include titanium or a titanium alloy. In some examples, the metallic material of the exterior portion 302 can include aluminum or an aluminum alloy. In some examples, the metallic material of the exterior portion 502 can include a 1000 series, 1100 series, 6000 series, or 7000 series aluminum alloy. For example, the metallic material of the exterior portion 302 can include 6013 aluminum, 7003 aluminum, 7075 aluminum, 1060 aluminum, or 1145 aluminum.

In some examples, as described herein, the interior portion 304 can be formed and/or deposited directly onto the pre-formed cosmetic exterior portion 302 through one or more 3D printing techniques. In some examples, the 3D printing processes used to form the interior portion 304 that is bonded to the exterior portion 302 can include one or more powder bed processes (such as selective laser melting, electron beam melting, direct metal laser sintering, and/or laser metal fusion), deposition processes (such as laser deposition welding, metal powder application, direct energy deposition, direct metal deposition, and/or laser cladding), and/or any other additive manufacturing processes or combinations thereof. Accordingly, in some examples, the interior portion 304 can have second, different values of the material properties of the exterior portion, such as different densities and/or thermal conductivities, or can have a second, different set of material properties that are independent of the first set of material properties. Additionally, the interior portion 304 can have a structure and/or microstructure indicative of the 3D printing or additive manufacturing technique used to form and/or deposit the interior portion 304 on the exterior portion 302.

In some examples, the exterior portion 302 can have a relatively high level of hardness as compared to the interior portion 304, and as described herein. In some examples, the exterior portion 302 can have a Vickers hardness value of between about 250 Hv and about 400 Hv, between about 280 Hv and about 370 Hv, or between about 300 Hv and about 350 Hv. In some examples, the exterior portion 302 can have a thickness greater than about 25 microns. In some examples, the exterior portion 302 can be up to about 500 microns, up to about 1 mm, up to about 1.5 mm, up to about 2 mm, up to about 3 mm, 5 mm, or even thicker. In some examples, the exterior portion 302 can have a thickness of about 2 mm.

The additively formed interior portion 304 can have a second, different set of material properties that are independent of the first set of material properties of the outer portion 302. In some examples, the exterior portion 302 and the interior portion 304 can be bonded or joined together such that they form the housing, or a portion thereof, and act as a substantially unitary body 300. In some examples, the bond between the exterior portion 302 and the interior portion 304 can be a metallurgical bond. In some examples, the exterior portion 302 and the interior portion 304 can be diffusion bonded.

In some examples, the component 300 can have an interface zone or diffusion zone between the exterior portion 302 and the interior portion 304. In some examples, the materials of the exterior portion 302 and interior portion 304 can be mixed or blended together to some degree, for example, as part of a diffusion bond between the two portions 302, 304. In some examples, the exterior portion 302 may not include substantially any material of the interior portion 304 outside of the diffusion zone. Similarly, the interior portion 304 may not include substantially any material of the exterior portion 302 outside of the diffusion zone. In some examples, the diffusion zone can have a thickness of less than about 1 micron. In some examples, the diffusion zone can have a thickness of between about 0.25 microns to about 1 micron.

In some examples, the interior portion 304 can include a metallic material. In some examples, the metallic material of the interior portion 304 can include copper or an alloy thereof. In some examples, the metallic material of the interior portion 304 can include one or more aluminum alloys. In some examples, the metallic material of the interior portion 304 can include a 1000 series, 1100 series, 6000 series, or 7000 series aluminum alloy. For example, the metallic material of the interior portion 304 can include 6013 aluminum, 7003 aluminum, 7075 aluminum, 1060 aluminum, or 1145 aluminum. In some examples, the metallic material of the interior portion 304 can include a 316 series stainless steel alloy, including 316L or 316Li stainless steel. In some examples, the metallic material of the interior portion 304 can include titanium or a titanium alloy.

In some examples, the interior portion 304 can have a thickness greater than about 25 microns. In some examples, the interior portion 304 can be up to about 500 microns, up to about 1 mm, up to about 1.5 mm, up to about 2 mm, up to about 3 mm, up to about 4 mm, up to about 5 mm, 7 mm, 10 mm, or even thicker. In some examples, the interior portion 304 can have a thickness of about 4 mm. In some examples, the interior portion 304 can have a Vickers hardness value of between about 100 Hv and about 200 Hv, between about 120 Hv and about 150 Hv, or between about 125 Hv and about 140 Hv.

Figure 3B:
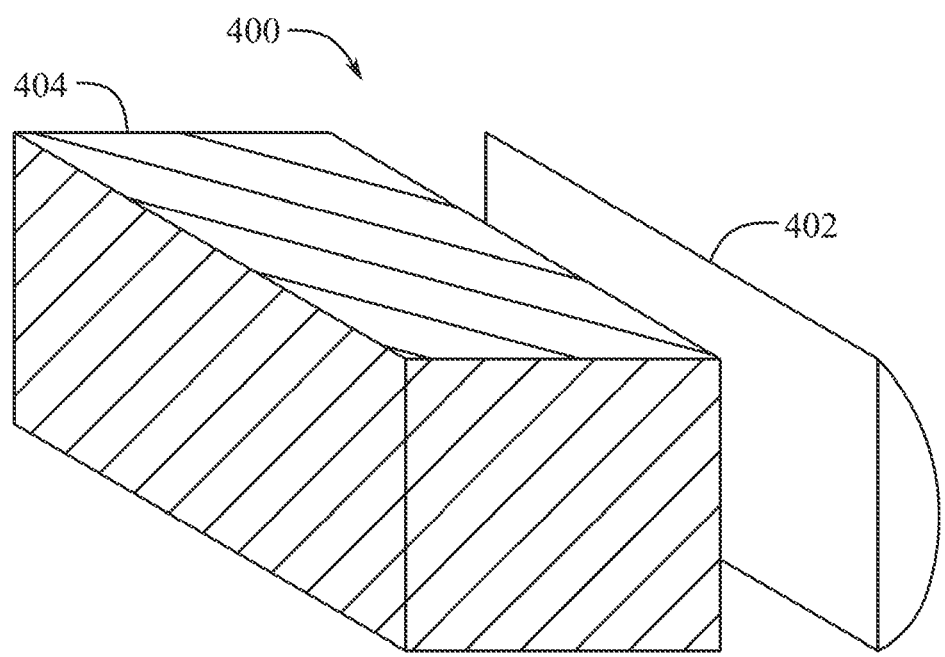
FIG. 3B shows a perspective exploded view of a component of an electronic device.

As shown in FIG. 3B, in some examples, the pre-formed exterior portion 402 can have substantially any shape or profile as desired. For example, as can be seen, the pre-formed exterior portion 402 can have a non-rectangular profile and can have, for example, a curved profile corresponding substantially to a desired final profile of the component. The exterior portion 402 can also have a substantially flat or planar surface onto which the interior portion 404 can be deposited, formed, or printed and to which the interior portion 404 is bonded. In some examples, however, the surface or portion of the pre-formed exterior portion 402 may not be planar and/or may include any number or amount of protrusions, recesses, or other non-planar features. Additionally, in some examples, the pre-formed exterior portion 402 can be a cosmetic portion of the component 400. That is, in some examples, the exterior portion or substrate 402 can at least partially define a cosmetic surface of the component or electronic device. Accordingly, in some examples, the exterior portion or substrate 402 can have a cosmetic finish, such as a polished, anodized, blasted, PVD, or other type of finish on one or more surfaces.

Figure 3C:
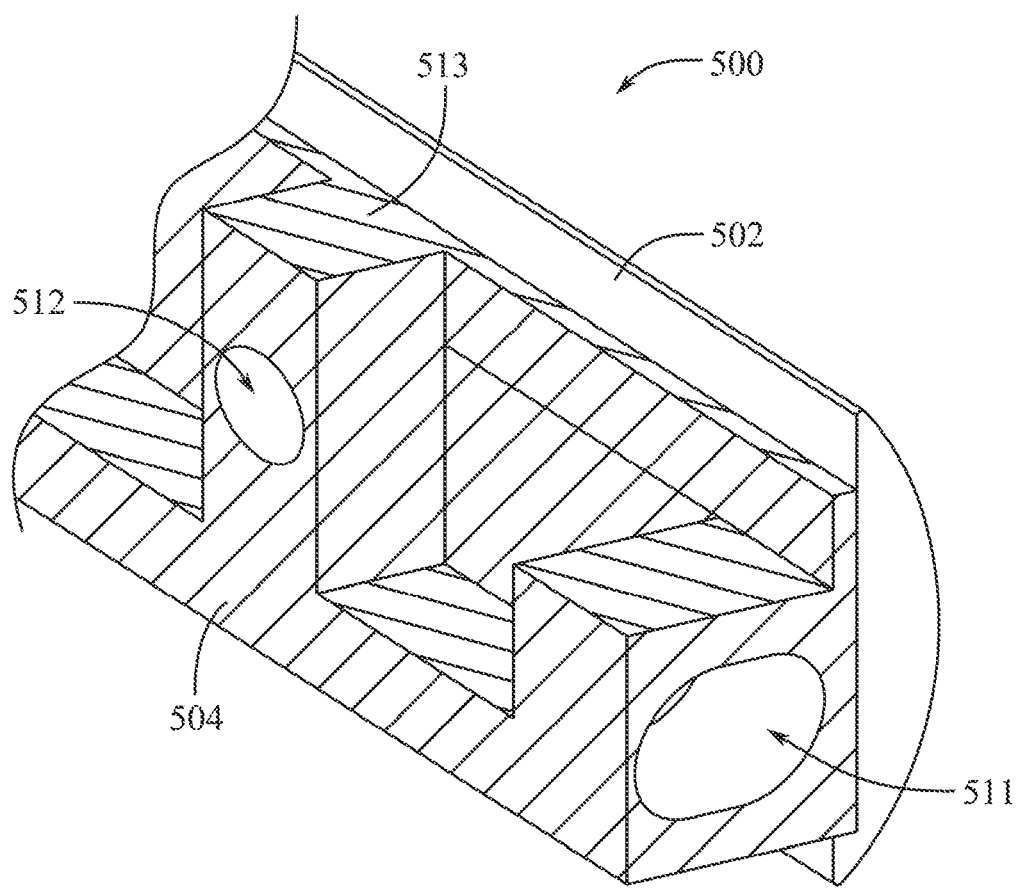
FIG. 3C shows a perspective close-up view of a component of an electronic device.

FIG. 3C shows a perspective view of a component 500 including a pre-formed substrate 502 and an additively manufactured portion 504 bonded thereto. In some examples, because the portion 504 can be 3D printed in substantially any shape as desired, it can be formed in a shape to define features 511, 512, 513. As can be seen, the feature 511, 512, 513 can include protruding features, recessed features, or combinations thereof. In some examples, a feature, such as feature 512, can define an aperture, a recess, a blind hole, a cavity, a protrusion, or combinations thereof. In some examples, a feature 511, 512, 513 can be an attachment feature for one or more other components of an electronic device. The component 500 and concepts illustrated in FIGS. 3A-3C can be applied to any of the components described herein, in any combination.

While any number or variety of components of an electronic device, such as electronic device 100, can be formed from or can include an additively manufactured portion, the structure of these components can be, for example, a component including an additively manufactured interior portion bonded to a pre-formed exterior portion, as described herein. The structure and materials of the exterior and interior portion, as well as the component itself, can apply to not only to the specific examples discussed herein, but to any number or variety of embodiments in any combination.

Examples described above, including those examples shown in FIGS. 3A-3C, as well as subsequent figures, include interior portions 304, 404, 504 that can be additively manufactured, in some cases to form features 511, 512, 513 shown in FIG. 3C, while the exterior portions 302, 402, 502 can be pre-formed. However, these examples are meant as non-limiting examples. In one or more other embodiments, referencing FIG. 3A, the exterior portion 302 can be additively manufactured. In at least one example, the interior portion 304 can be pre-formed and bonded to the additively manufactured exterior portion 302. In at least one example, the interior portion 304 can also be additively manufactured and bonded to the additively manufactured exterior portion 302.

In at least one example, the exterior portion 302 can be additively manufactured to include features such as ports, for example port 126 and/or opening 146 shown in FIG. 1A, or other features such as audio meshes or connection components configured to connect to internal components. In one example, the exterior portion 302 can be additively manufactured to form functional components such as buttons (e.g., control input 142 in FIG. 1A), speaker modules, or other functional components. In one example, high-strength 3D-printing materials can be used to form the additively manufactured exterior portion 302, including metal-matrix compositions. In one example, where an aperture in the external portion 302 is either pre-drilled or formed via additive manufacturing, a high strength material can be additively manufactured at or around the aperture to bolster the strength of the external portion 302 at or around the aperture. High strength materials can also be used during the additive manufacturing process to form high-strength threaded holes.

In one example, additive manufacturing can be used to form the exterior portion 302 to cover up gaps or joints in the housing for cosmetic and corrosion purposes. For example, during formation, aluminum can be printed onto a steel substrate to achieve reduced density, and then steel can be printed over the aluminum to hide the cosmetic appearance of the aluminum and to prevent galvanic corrosion. This can also be used to hide joints where certain features are attached to the exterior portion 302.

In at least one example, the exterior portion 302 can be additively manufactured to include surface architectures that promote interlocking, wetting, bonding, and so forth. In one example, the surface of the exterior portion 302 can be printed/additively manufactured to form a texture or features that promote attachment to the interior portion 304. In at least one example, micro-scale structures can be incorporated with the exterior or interior portions 302, 304. For example, the exterior or interior portions 302, 304 can include micro-features on the scale of 10's of microns or less to form hydrophobic surfaces, surfaces that feel like glass, or other surface micro-features that promote chemical etching of the surface. In one example, grain structures, including printing titanium grain structures can be accomplished via additively manufacturing of the interior or exterior portions 304, 302 to increase surface area of pores after etching the additively manufactured portion 304, 302.

Figure 4A:
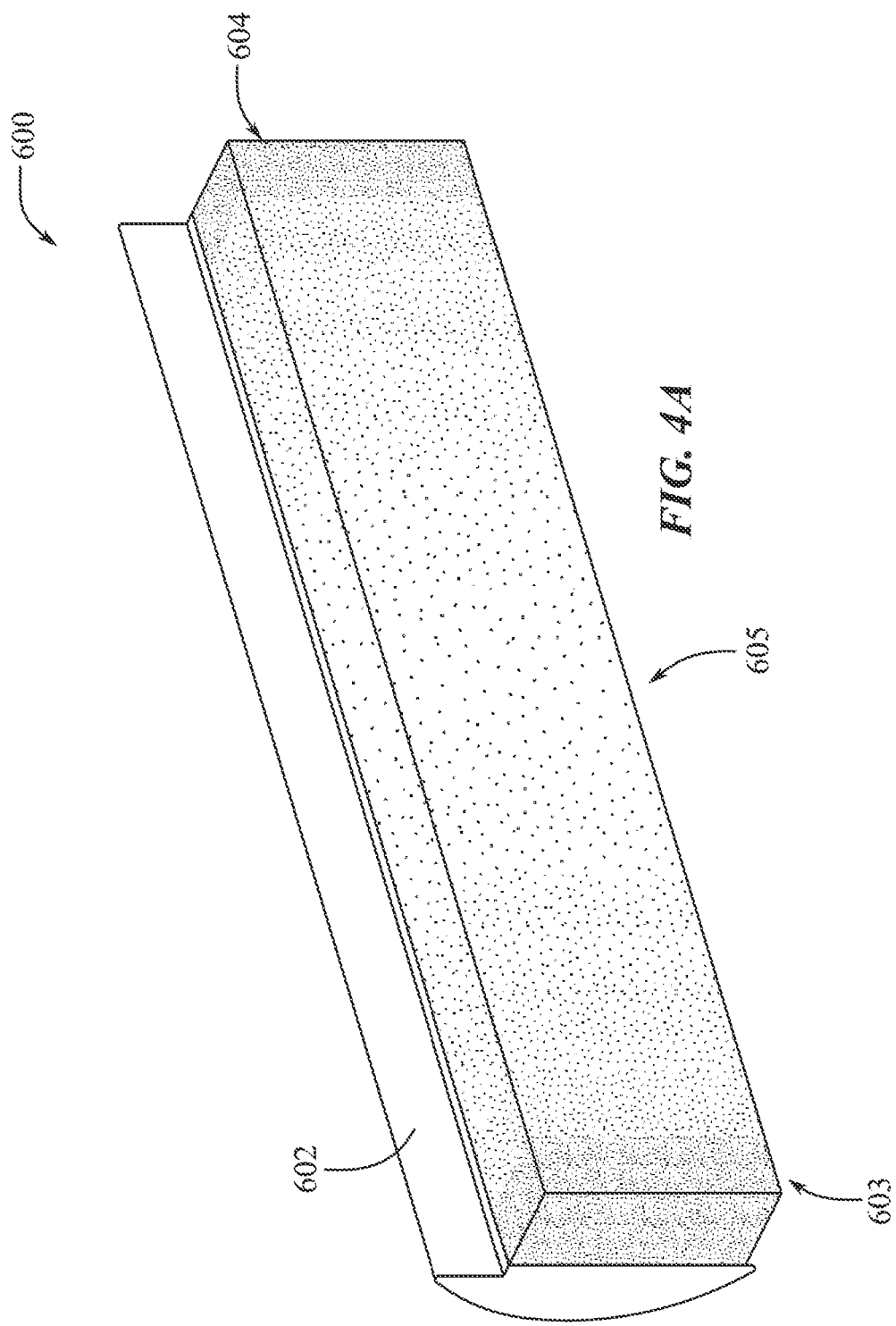
FIG. 4A shows a perspective view of a component of an electronic device.

Various embodiments of components are described below, with reference to FIGS. 4A-4B. FIG. 4A shows a perspective view of a component 600 including a pre-formed cosmetic outer or exterior portion 602 and an additively formed or deposited inner or interior portion 604. The exterior portion or substrate 602 can include any of the materials of the exterior portions described herein, including any type of metal. The interior portion 604 can similarly include any of the materials of the interior portions described herein, including any type of metal, and can include a different metal than the exterior portion 602. In some examples, because the interior portion 604 has been formed by an additive manufacturing process that can control the formation or deposition of the material in 3D space, one or more material properties of the interior portion 604 can be varied or different at different locations in space.

For example, as shown in FIG. 4A, the interior portion 604 can have a material property, here represented by a density of shading, that can transition along a gradient from one value at location 603 to another value at location 605 along the interior portion 604. In some examples, the interior portion 604 can have a variation in one or more material properties in any form as desired, including a gradient variation, a stepped variation, an alternating variation, or any other configuration as desired. In some examples, the material property can be a density or porosity of the interior portion 604. That is, in some examples, the interior portion 604 can have a first density at portion 603 and a second, different density at portion 605, again represented by the shading shown in FIG. 4A. In some examples, the first density can be higher than the second density. In some examples, the first density can be lower than the second density. In some examples, the density of the interior portion 604 can be controlled by varying the porosity and/or powder size of the material that forms the interior portion 604. In some examples, the elemental composition of the material itself can be varied to vary the density of the interior portion 604. In some examples, material properties of the interior portion 604 other than the density can be varied. In some examples, the density of any of the portions or locations of the interior portion 604 can be varied from a density of about 10% to a density of about 100%. In other words, the porosity of the interior portion 604 can be varied from about 90% porosity to substantially 0% porosity at any number and size of locations as desired. In some examples, substantially any property of the interior portion 604 can be controlled or varied between two or more portions 603, 605. For example, the thermal conductivity and/or electrical conductivity can be varied between portions 603, 605 as shown.

Figure 4B:
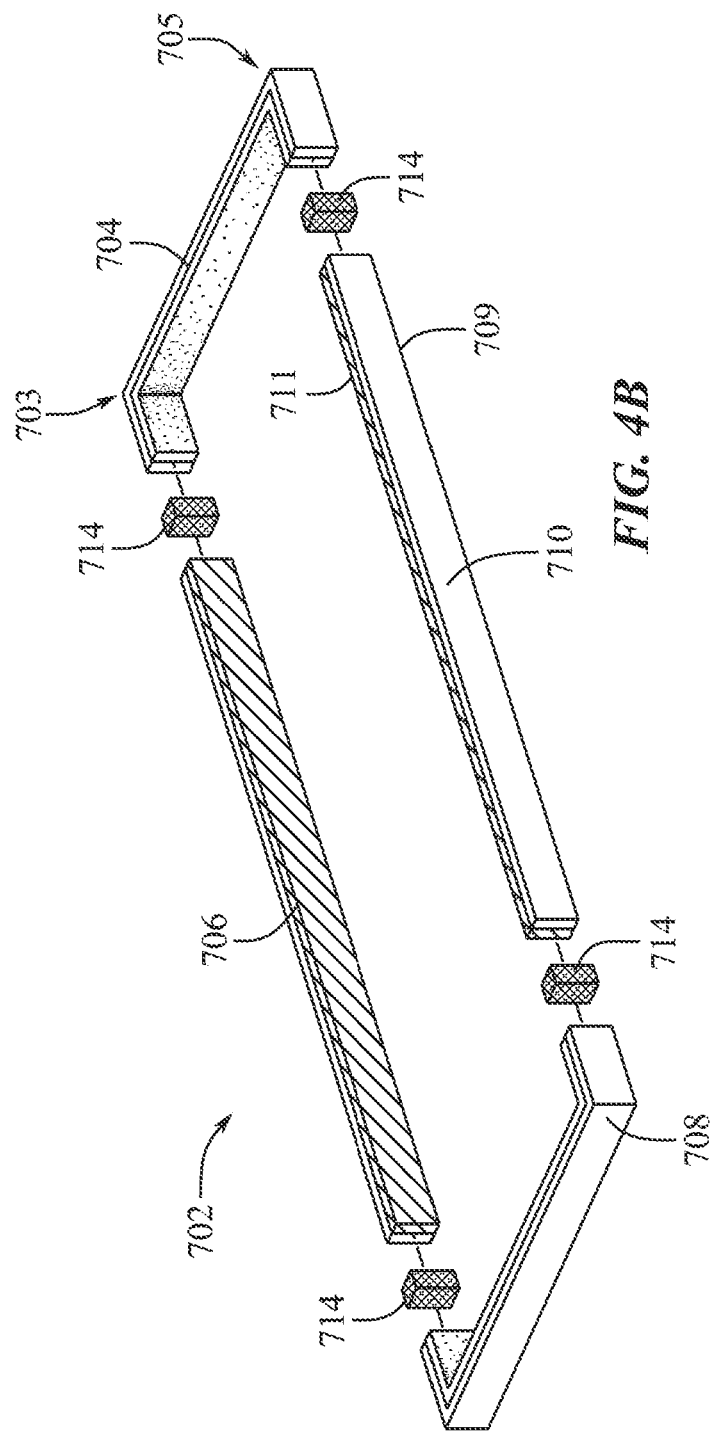
FIG. 4B shows a perspective exploded view of a component of an electronic device.

FIG. 4B shows a perspective exploded view of a housing 702 for an electronic device that can include a first sidewall component 704, a second sidewall component 706, a third sidewall component 708 (opposite the first sidewall component 704), and a fourth sidewall component 710. The housing 702 can be substantially similar to, and can include some or all of the features of the housings described herein, such as housing 202. In some examples, and as described herein, the components 704, 706, 708, 710 can be separated and/or joined together by portions of a moldable non-metallic material 714 that can penetrate or interlock with engagement structures or features defined by the components 704, 706, 708, 710, such as interlock features defined by the additively manufactured interior portion of the components 704, 706, 708, 710.

In some examples, one or more of the sidewall components 704, 706, 708, 710, such as sidewall component 710 can include an exterior portion 709 that can be formed from a first material and an interior portion 711 of the sidewall component 710 that can include a second, different material and can be additively formed or deposited on, and diffusion bonded to, the exterior portion 709. Additionally, the interior portions, such as interior portion 711, can have one or more varied material properties between two or more portions of the interior portion 711. In some examples, and as can be seen with sidewall component 704, a property of the interior portion can be higher at one or more desired locations where it may be advantageous and lower at one or more other desired locations where it may not be necessary. For example, the interior portion of component 704 can have a higher density, here represented by darker shading, at the corners 703, 705 and a lower density in the middle of the component 704. Such a configuration can provide a higher desired level of strength at the corners, where the housing 702 may be more likely to experience a high stress event, while still providing a decreased weight because of the lower density in the middle portion of component 704.

While any number or variety of components of an electronic device, such as electronic device 100, can be formed from or can include an additively manufactured portion, the structure of these components can be, for example, a component including an additively manufactured interior portion bonded to a pre-formed exterior portion, as described herein. The structure and materials of the exterior and interior portion, as well as the component itself, can apply to not only to the specific examples discussed herein, but to any number or variety of embodiments in any combination. Various embodiments of components are described below, with reference to FIGS. 5A-7.

Figure 5A:
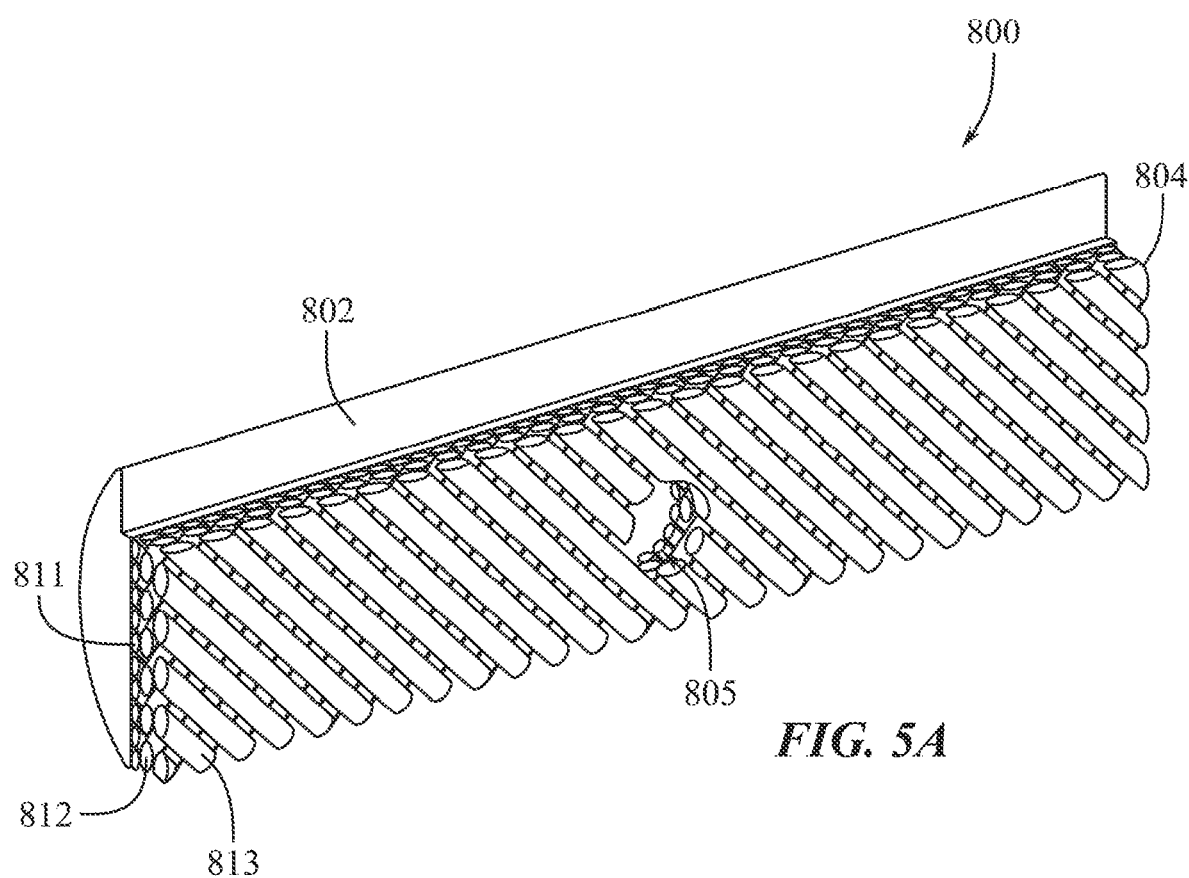
FIG. 5A shows a perspective view of a component of an electronic device.

FIG. 5A shows a perspective view of a component 800 including a pre-formed cosmetic outer or exterior portion 802 and an additively formed or deposited inner or interior portion 804. The exterior portion or substrate 802 can include any of the materials of the exterior portions described herein, including any type of metal. The interior portion 804 can similarly include any of the materials of the interior portions described herein, including any type of metal, and can include a different metal than the exterior portion 802. In some examples, because the interior portion 804 has been formed by an additive manufacturing process that can control the formation or deposition of the material in 3D space, the interior portion 804 can include a 3D structure that may not be able to be formed through conventional manufacturing processes, such as casting, forging, molding, and/or subtractive processes.

For example, as shown, the interior portion 804 can include a multilayered structured, with each layer 811, 812, 813 formed from multiple beams or rows of deposited material. In this example, the overlapping cross beam structure formed by the layers 811, 812, 813 can also define an array of negative spaces, voids, or cavities between the beams or rows of each layer 811, 812, 813. In some examples, the voids of the array can be fluidly interconnected voids, or voids in fluid communication with one another. In some examples, the size of the beams, rows, or portions making up each layer 811, 812, 813 can be varied or selected as desired in order to obtain a desired level of density or porosity. Additionally, although only three layers 811, 812, 813 are shown, the interior portion 804 can include any number of layers as desired. In some examples, the rows or each layers can abut one another so that any desired layer 811, 812, 813, or the entire interior portion 804 is substantially pore-free or fully dense. Additionally, as shown, the deposition of the layers 811, 812, 813 can be controlled to form features in the interior portion, such as the aperture 805. In some examples, any features can be formed by the interior portion 804, for example, as described with respect to FIG. 3C.

Figure 5B:
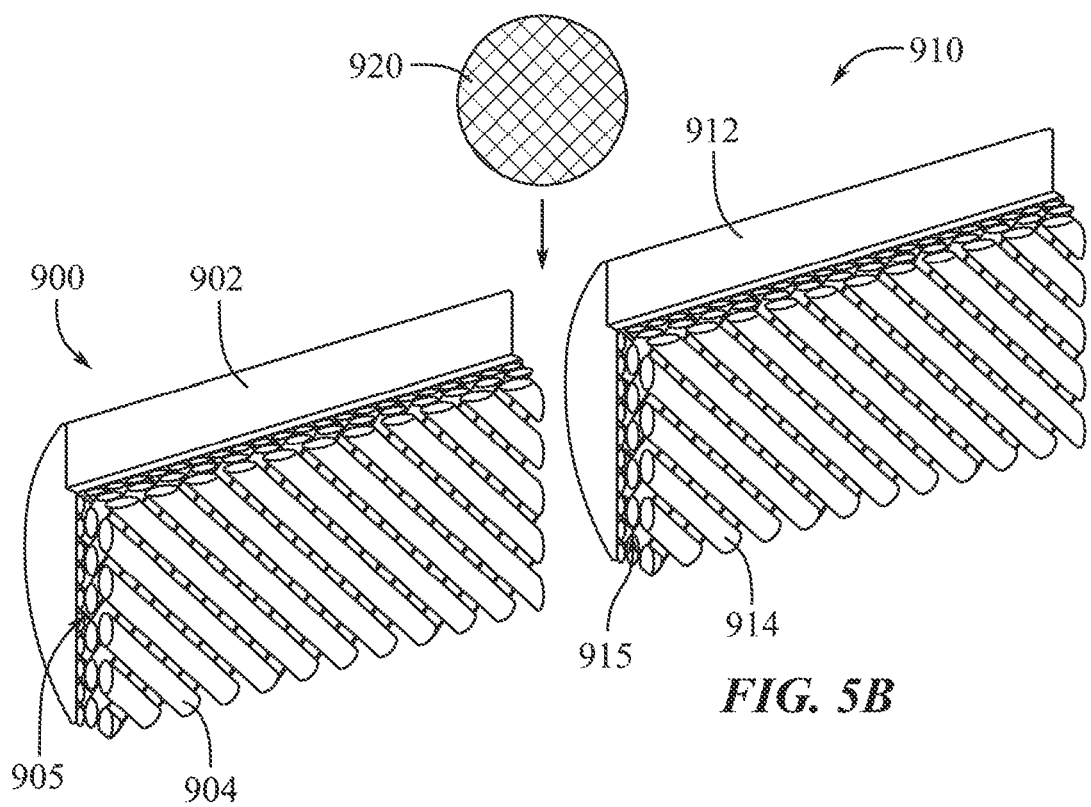
FIG. 5B shows a perspective view of portions of component of an electronic device.

FIG. 5B shows a perspective view of a stage in a process of joining a first part or portion 900 to a second part or portion 910 with a moldable material 920, such as a non-metallic material 920. In some examples, the first portion 900 and second portion 910 can be joined by the moldable material 920 to form a housing or housing component 930. In this particular example, each of the parts 900, 910 can have a substantially similar structure to the component 800 described with respect to FIG. 5A.

That is, in some examples, the first part 900 can include a pre-formed exterior portion 902 and an additively formed interior portion 904 bonded thereto. The interior portion 904 can include multiple layers and can define an array of negative spaces, voids, or cavities 905 that can be in fluid communication with one another. In some examples, this structure of the interior portion 904 can be considered an engagement structure that can engage the moldable material 920 as described herein. Similarly the second part 910 can include a pre-formed exterior portion 912 and an additively formed interior portion 914 bonded thereto. The interior portion 914 can include multiple layers and can define an array of negative spaces, voids, or cavities 915 that can be in fluid communication with one another. In some examples, this structure of the interior portion 914 can be considered an engagement structure that can engage the moldable material 920 as described herein.

Figure 5C:
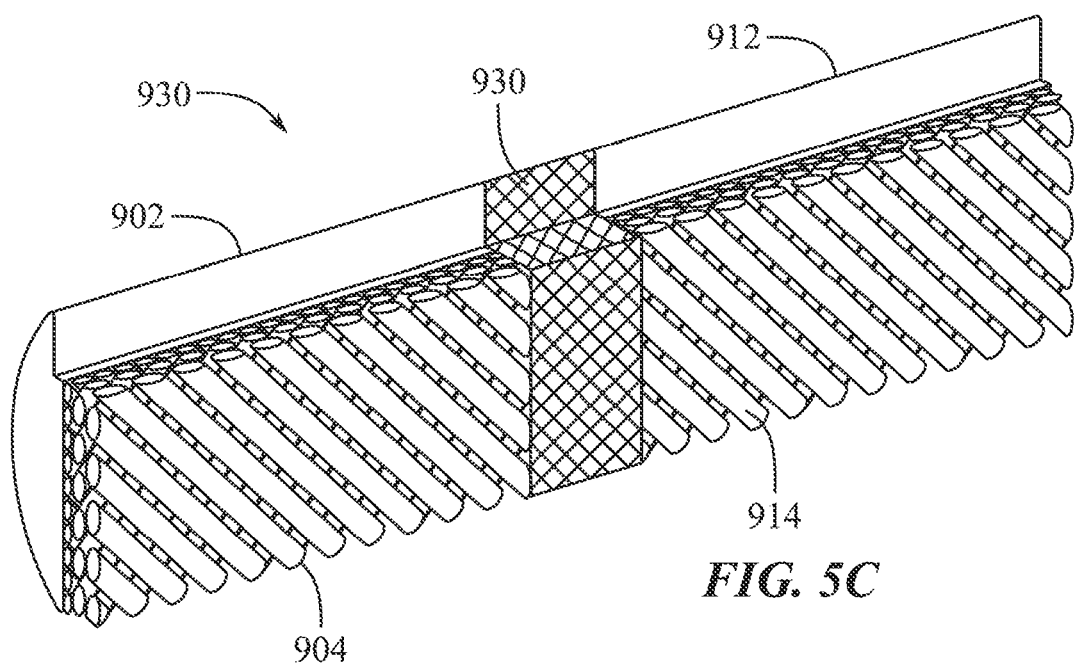
FIG. 5C shows a perspective view of a component of an electronic device.

FIG. 5C shows a perspective view of the component 930 that has been formed by joining the first part 900 to the second portion 910 with the moldable material 920 as described herein. That is, the moldable material has been provided to the engagement structures defined by each part 900, 910, for example, including the array of negative spaces, voids, or cavities 905, 915. By flowing or being provided into these arrays of cavities 905, 915, the moldable material 920 can extend into the interior portion 904, 914 and can form a secure and strong mechanical bond therewith, while also electrically insulating each of the parts 900, 910 from one another and providing a desired cosmetic appearance. Although the example shown in FIGS. 5A-5C is illustrated as having a particular structure of the interior portions and engagement structures, the interior portions and/or engagement structures can include substantially any shape as desired.

Figure 6:
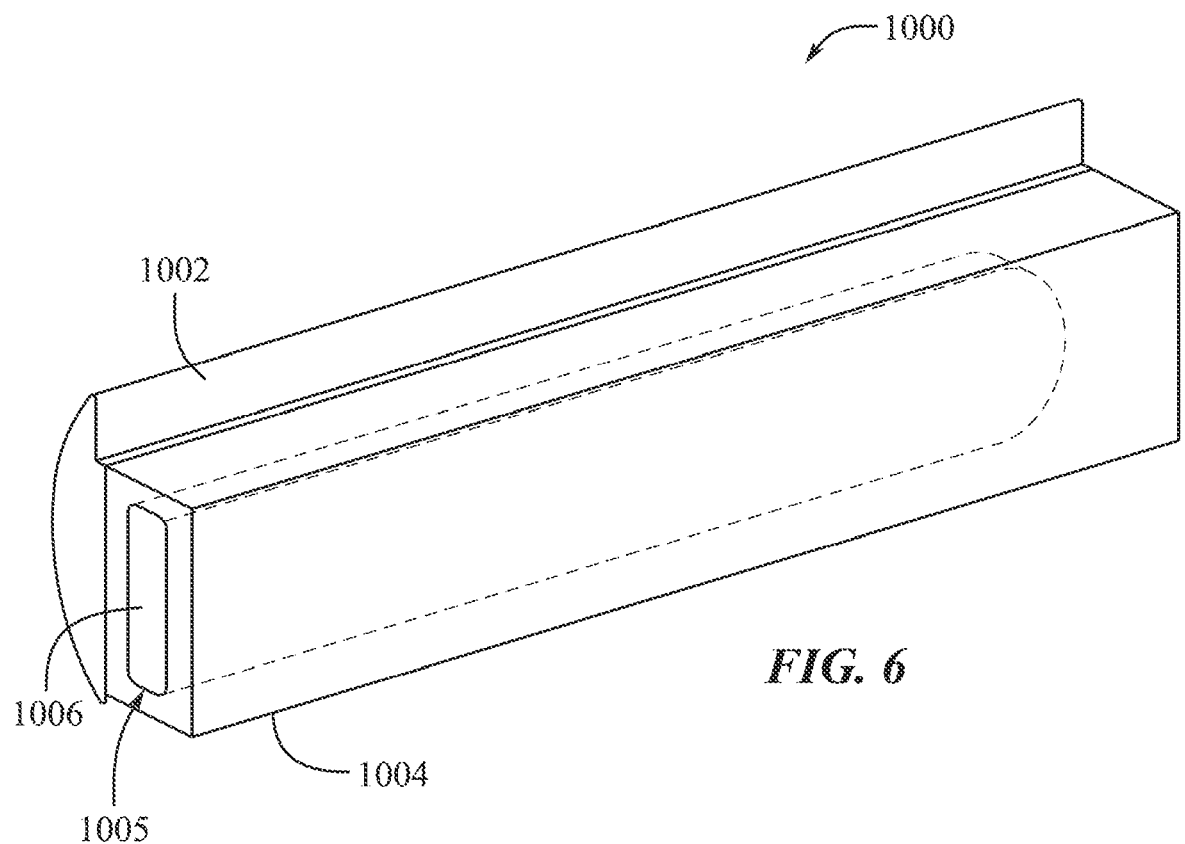
FIG. 6 shows a perspective view of a component of an electronic device.

FIG. 6 shows a perspective view of a component 1000 including a pre-formed cosmetic outer or exterior portion 1002 and an additively formed or deposited inner or interior portion 1004. The exterior portion or substrate 1002 can include any of the materials of the exterior portions described herein, including any type of metal. The interior portion 1004 can similarly include any of the materials of the interior portions described herein, including any number and/or type of metal, and can include a different metal than the exterior portion 1002. In some examples, because the interior portion 1004 has been formed by an additive manufacturing process that can control the formation or deposition of the material in 3D space, the interior portion 1004 can include a structure that may not be able to be formed through conventional manufacturing processes, such as casting, forging, molding, and/or subtractive processes.

For example, as shown in FIG. 6, the interior portion 1004 can include a first portion 1005 that can define a second portion or volume 1006. In some examples, the volume 1006 can be filled with material, either during the formation of the first portion 1005 or after the first portion 1005 has been completely formed. In some examples, the first portion 1005 can substantially encompass or surround the second portion or volume 1006. In some examples, however, the first portion 1005 can define the second portion 1006 and can also define an aperture or orifice in communication with the second portion 1006. In some examples, the second portion 1006 can include a second material that is different than the material of the first portion 1005. In some examples, the second portion 1006 can have one or more material properties that are different than the material properties of the first portion 1005 as described herein. That is, in some examples, the first portion can have a property (such as density or thermal conductivity) having a first value and the second portion can have a second, different value of that property.

In some examples, the second portion 1006 can include empty space or a gas, such as air. In some examples, this configuration can provide for a relatively lightweight component 1000 that still has desired levels of other properties. In some examples, the second portion 1006 can include or be filled with a liquid or other material. In some examples, the second portion 1006 can include a self-healing or self-sealing material. That is, in some examples, the second portion 1006 can be filled with or contain a material that can flow into, fill, and/or seal any cracks, fissures, or breaks that may form in the exterior portion 1002 and/or interior portion 1004. In some examples, the self-healing material can include a self-curing polymer. In some examples, the self-healing material can serve to flow into and seal or heal any cracks, fissures, breaks, or gaps between the component 1000 and a moldable material that may be secured to an engagement structure defined by the component 1000, for example, to maintain a desired level of sealing of an electronic device including the component 1000. Although the second portion 1006 is shown as having a particular shape in FIG. 6, the second portion can include any shape as desired. Additionally, the first portion 1005 can define any number, size, and shape of second portion 1006 as desired.

Figure 7:
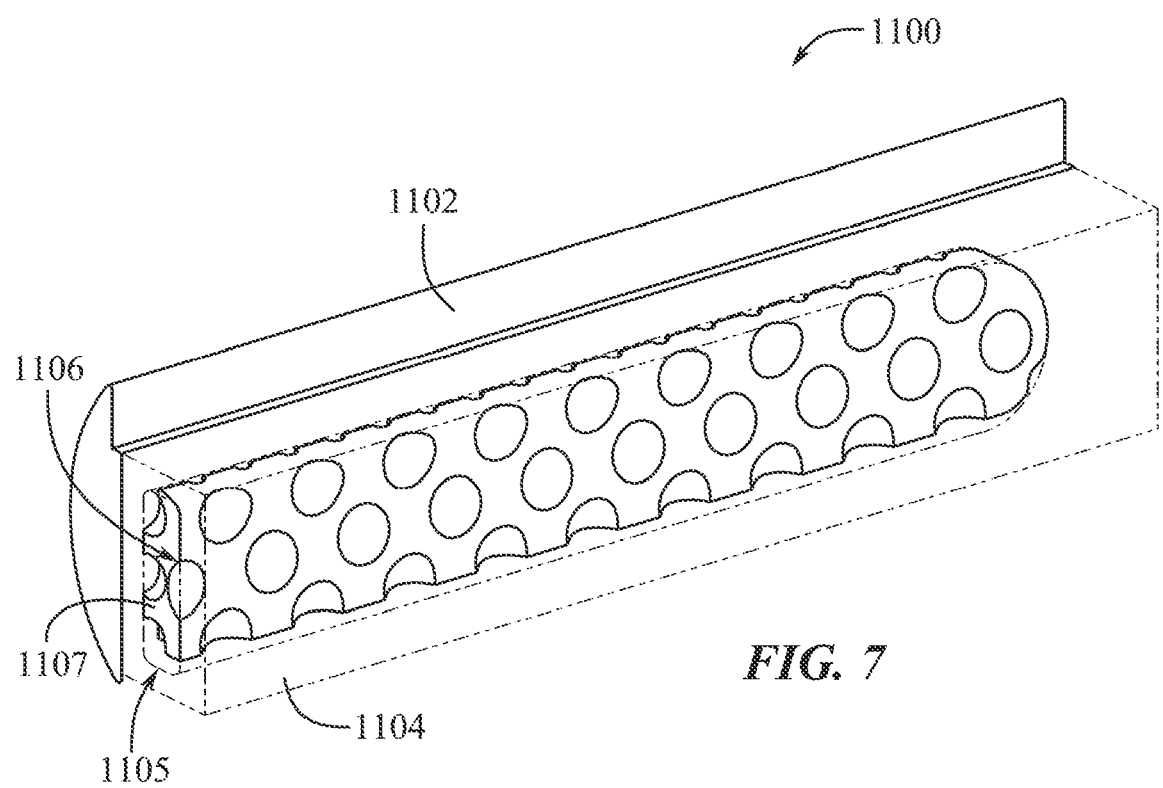
FIG. 7 shows a perspective view of a component of an electronic device.

FIG. 7 shows a perspective view of a component 1100 including a pre-formed cosmetic outer or exterior portion 1102 and an additively formed or deposited inner or interior portion 1104. The interior portion 1104 can include a first portion 1105 that can define a second portion or volume 1106. In some examples, the first portion 1105 can substantially encompass or surround the second portion or volume 1106. In some examples, however, the first portion 1105 can define the second portion 1106 and can also define an aperture or orifice in communication with the second portion 1106.

In some examples, the second portion 1106 can include or contain one or more components 1107, including 1105. For example, the component 1107 can include a polymer or foam having any one or more operational and/or electrical components 1107. For example, the component 1107 can include a circuit, wire, antenna, electrical conductor, flexible electrical circuit, sensor, or other component. In some examples, the component 1107 can include a different structure than the first portion structure as desired, including an open cell structure as shown. In some examples, the component 1107 can provided additional functionality to an otherwise structural component 1102, or can provide additional strength or insulation without adding significant weight to the component 1102.

While any number or variety of components of an electronic device, such as electronic device 100, can be formed from or can include an additively manufactured portion, the structure of these components can be, for example, a component including an additively manufactured interior portion bonded to a pre-formed exterior portion, as described herein. The structure and materials of the exterior and interior portion, as well as the component itself, can apply to not only to the specific examples discussed herein, but to any number or variety of embodiments in any combination. Various embodiments of components are described below, with reference to FIGS. 8A-8D.

Figure 8A:
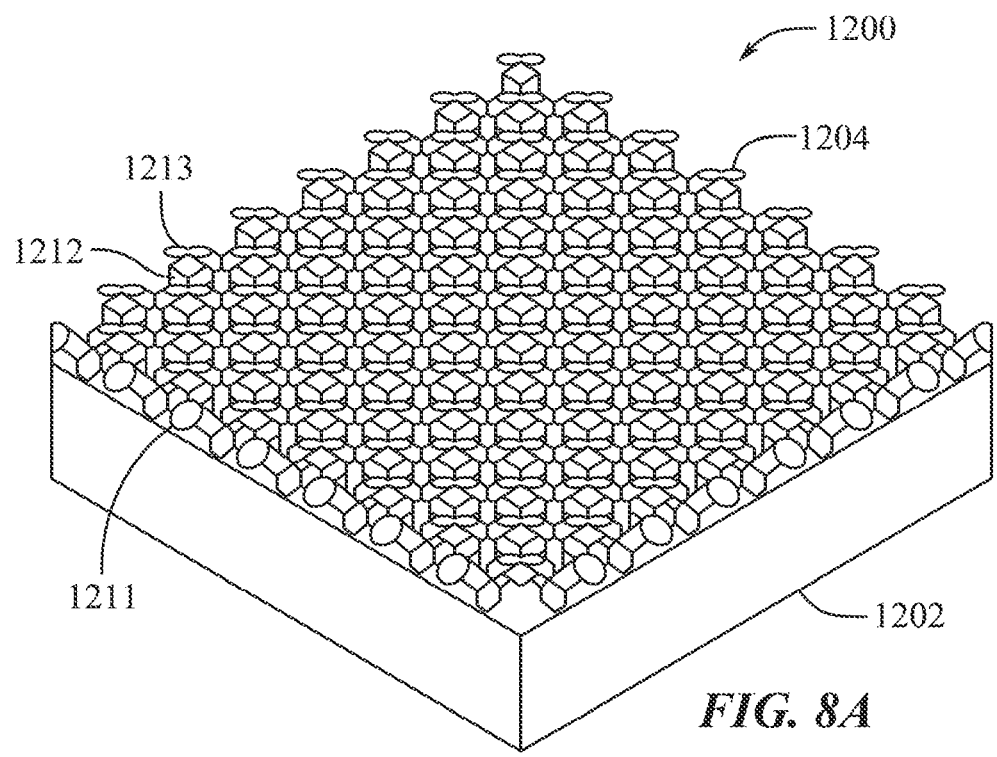
FIG. 8A shows a perspective view of a portion of a component of an electronic device.

Referring now to FIG. 8A, as described herein, in some examples, a component 1200 can include a pre-formed substrate or exterior portion 1202 and an additively formed or 3D printed interior portion 1204 bonded thereto. In some examples, and as described with respect to FIGS. 5A-5C, the interior portion 1204 can define one or more engagement structures. An engagement structure defined by the interior portion 1204 can be configured to mechanically engage with a moldable material that is flowed or provided into the features of the engagement structure to provide a strong and secure mechanical bond between the component 1200 and a moldable material. Although a particular example of an engagement structure is shown in FIGS. 5A-5C, other configurations and structures are expressly contemplated. In some examples, a component 1200 can include an engagement structure that can only be formed by additive manufacturing processes.

Figure 8B:
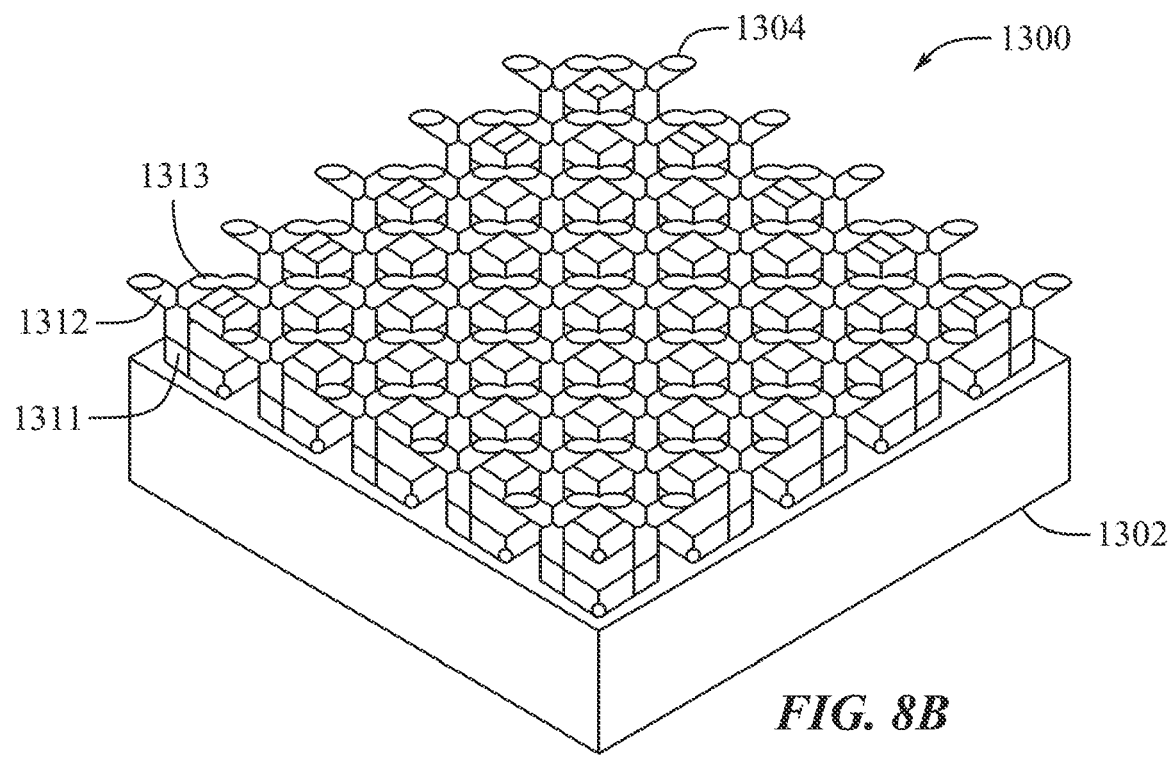
FIG. 8B shows a perspective view of a portion of a component of an electronic device.

For example, as shown in FIG. 8A, an engagement structure defined by the interior portion 1204 of a component 1200 can have a diamond lattice shape that can be formed by multiple layers 1211, 1212, 1213 of intersecting beams or portions of additively formed material. The diamond lattice structure can be thought of as having multiple repeating diamond lattice cells that extend across a desired area of the interior portion 1204. FIG. 8B shows an example of a component 1300 including an exterior portion 1302 and an interior portion 1304. The interior portion 1304 again includes multiple layers 1311, 1312, 1312 that each include beams which intersect to form the diamond lattice structure. As can be seen in FIGS. 8A and 8B, the size or diameter of the beams of each layer 1311, 1312, 1313, as well as the spacing between the beams can be varied as desired. The spacing between the beams in FIG. 8B, for example, is larger than the diamond lattice structure shown in FIG. 8A.

In some examples, a diameter of a beam of the diamond lattice structure of components 1200, 1300 can be between about 0.1 mm and about 0.5 mm, between about 0.15 mm and about 0.4 mm, or between about 0.18 mm and about 0.3 mm. In some examples, the diamond lattice structure can be thought of as having multiple repeating diamond lattice cells that extend across a desired area of the interior portion 1204, 1304. In some examples, the size of these cells can be between about 0.5 mm and about 1 mm, for example, about 0.7 mm, 0.8 mm, 0.9 mm, or 1 mm. In some examples, the diamond lattice structure of a component 1200, 1300 can have any number of layers and any thickness as desired. In some examples, the diamond lattice structure can have a thickness between about 0.5 mm and about 1 mm, for example, about 0.6 mm, 0.8 mm, 0.9 mm, or 1 mm.

Figure 8C:
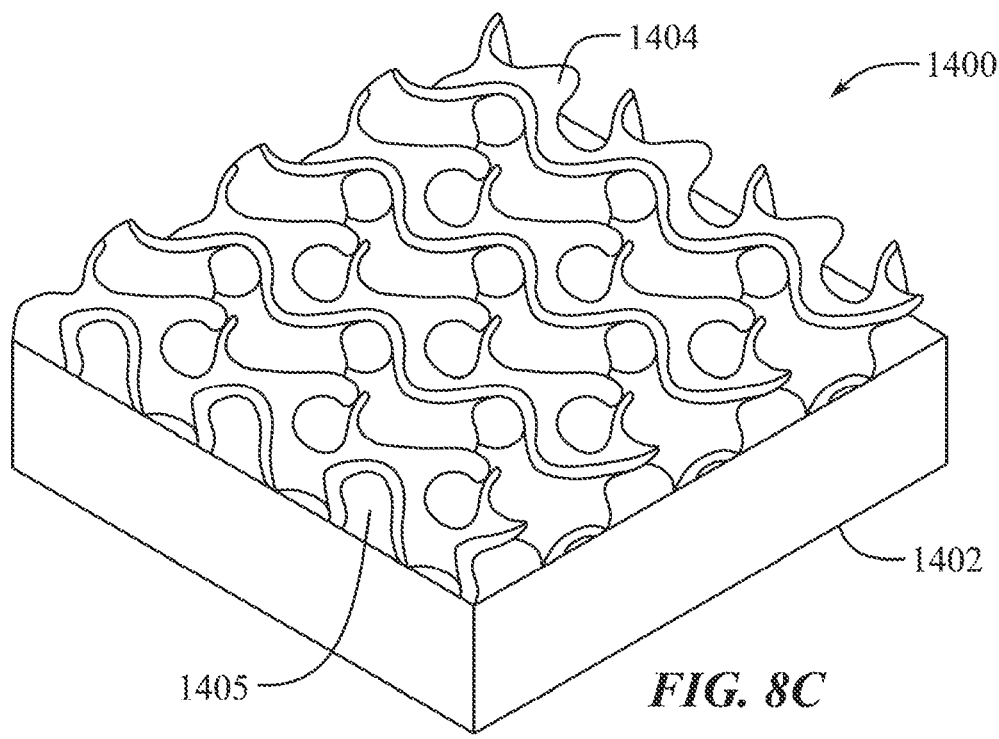
FIG. 8C shows a perspective view of a portion of a component of an electronic device.
Figure 8D:
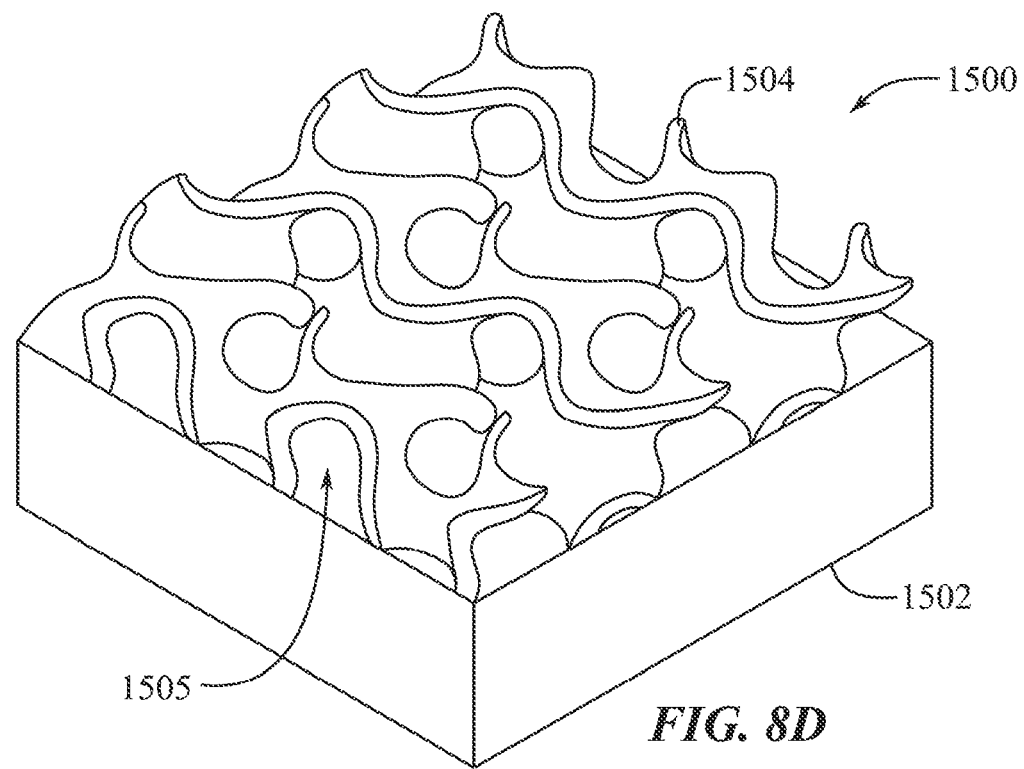
FIG. 8D shows a perspective view of a portion of a component of an electronic device.

FIG. 8C and FIG. 8D show additional examples of components 1400, 1500 that can include an exterior portion 1402, 1502 and an additively formed interior portion 1404, 1504 bonded thereto. As shown in FIG. 8C, and FIG. 8D, the interior portions 1404, 1504 can define an engagement structure having a gyroid shape or pattern. That is, the interior portions 1404, 1504 can define an engagement structure that is an infinitely connected triply periodic minimal surface. As shown in FIGS. 8C and 8D, the size or dimension of this gyroid structure can be chosen as desired.

In some examples, a diameter of a beam of the gyroid structure of components 1400, 1500 can be between about 0.1 mm and about 0.5 mm, between about 0.15 mm and about 0.4 mm, or between about 0.18 mm and about 0.3 mm. In some examples, the gyroid structure can be thought of as having multiple repeating gyroid lattice cells that extend across a desired area of the interior portion 1404, 1504. In some examples, the size of these cells can be between about 1 mm and about 2 mm, for example, about 1.4 mm, 1.6 mm, 1.8 mm, or 2 mm. In some examples, the gyroid lattice structure of a component 1400, 1500 can have any number of layers and any thickness as desired. In some examples, the gyroid lattice structure can have a thickness between about 0.5 mm and about 1 mm, for example, about 0.6 mm, 0.8 mm, 0.9 mm, or 1 mm.

While any number or variety of components of an electronic device, such as electronic device 100, can be formed from or can include an additively manufactured portion, the structure of these components can be, for example, a component including an additively manufactured interior portion bonded to a pre-formed exterior portion, as described herein. The structure and materials of the exterior and interior portion, as well as the component itself, can apply to not only to the specific examples discussed herein, but to any number or variety of embodiments in any combination.

Various embodiments of components are described below, with reference to FIGS. 9-11.

Figure 9:
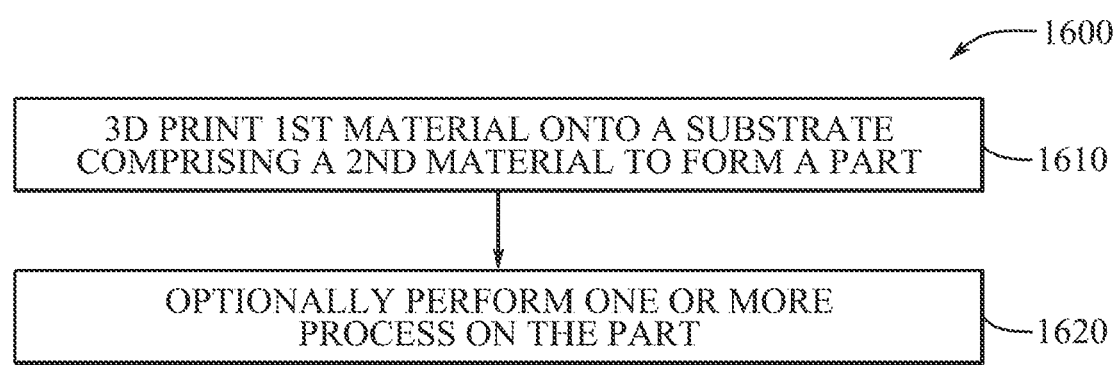
FIG. 9 shows a process flow diagram for a method of forming a component for an electronic device.

FIG. 9 illustrates a process flow diagram of an exemplary process for forming a component or part for an electronic device. The process 1600 for forming the component can include 3D printing a first material onto a pre-formed substrate, such as an exterior portion as described herein, including a second material to form a part, at block 1610. Once the part is formed, one or more processes can optionally be carried out on the part or component, at block 1620.

At block 1610, a first material can be formed or deposited onto a pre-formed substrate including a second material by a 3D printing or additive manufacturing process as described herein. In some examples, the first material can include any of the materials described with respect to any of the additively formed portions described herein. Additionally, the second material can include a second, different material having a second, different set of one or more material properties.

At block 1620, one or more processes can optionally be carried out or performed on the part or component formed at block 1610. These processes can include any number or type of treatment and/or finishing processes. For example, the process or processes optionally carried out at block 1620 can include chemical and/or mechanical polishing processes, coating processes, etching processes, machining processes, deposition processes, dying processes, anodizing processes, machining processes, and/or assembly processes.

Figure 10:
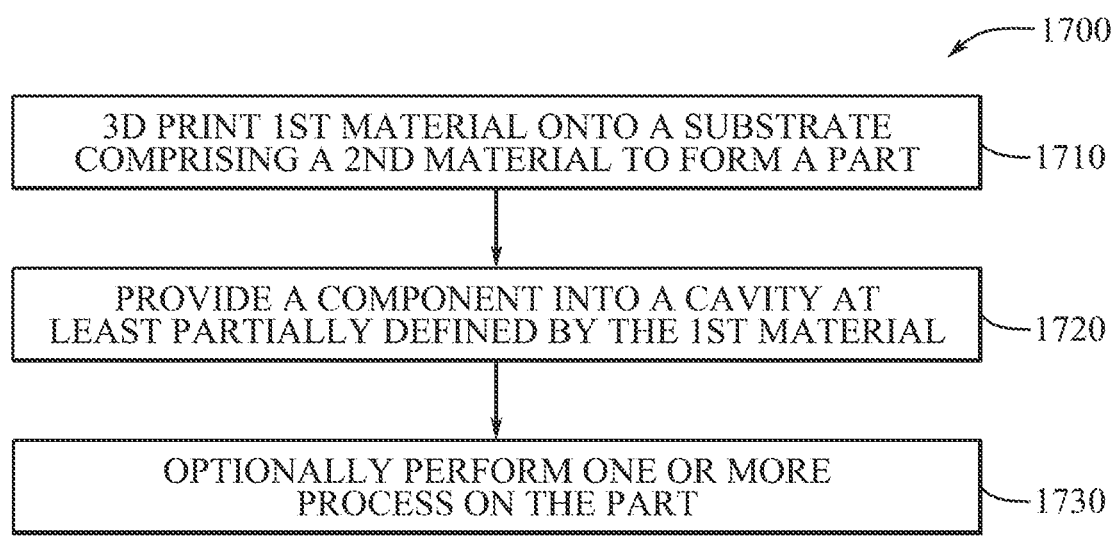
FIG. 10 shows a process flow diagram for a method of forming a component for an electronic device.

FIG. 10 illustrates a process flow diagram of an exemplary process for forming a component or part for an electronic device. The process 1700 for forming the component can include 3D printing a first material onto a pre-formed substrate, such as an exterior portion as described herein, including a second material to form a part, at block 1710. At block 1720, a component or material can be provided into a cavity at least partially defined by the first material, also referred to as the interior portion, of the part formed at block 1720. At block 1730, one or more processes can optionally be carried out on the part or component.

At block 1710, a first material can be formed or deposited onto a pre-formed substrate including a second material by a 3D printing or additive manufacturing process as described herein. In some examples, the first material can include any of the materials described with respect to any of the additively formed portions described herein. Additionally, the second material can include a second, different material having a second, different set of one or more material properties. The first material can be formed or deposited to at least partially define a volume or cavity as described herein.

At block 1720, a component or material can be provided into a cavity at least partially defined by the first material. In some examples, the component or material can include one or more operational and/or electrical components, such as a circuit, wire, antenna, electrical conductor, flexible electrical circuit, sensor, or other component. In some examples, the component can include a different structure than the structure of the first material, including an open cell structure. In some examples, the material can include a self-healing or self-sealing material.

At block 1730, one or more processes can optionally be carried out or performed on the part. These processes can include any number or type of treatment and/or finishing processes. For example, the process or processes optionally carried out at block 1730 can include chemical and/or mechanical polishing processes, coating processes, etching processes, machining processes, deposition processes, dying processes, anodizing processes, and/or painting processes.

Figure 11:
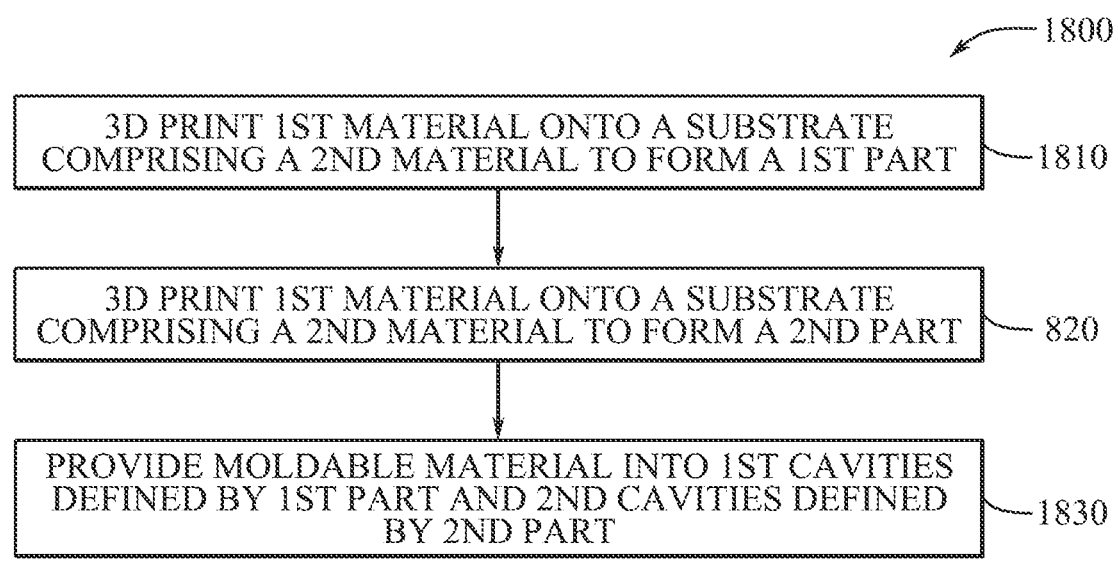
FIG. 11 shows a process flow diagram for a method of forming a component for an electronic device.

FIG. 11 illustrates a process flow diagram of an exemplary process for forming a component for an electronic device. The process 1800 for forming the component can include 3D printing a first material onto a pre-formed substrate, such as an exterior portion as described herein, including a second material to form a first part, at block 1810. The process 1800 further includes 3D printing a first material onto a pre-formed substrate, such as an exterior portion as described herein, including a second material to form a second part, at block 1820. At block 1830, at least some of the first cavities defined by the first part and at least some of the second cavities defines by the second part can be at least partially filled with a moldable non-metallic material, as described herein, to form a component, such as a housing component.

In some examples, and as described herein, the moldable non-metallic material can include an electrically inert, or insulating, material(s), such as plastics and/or resin, as non-limiting examples. In some examples, the moldable material may not be insulating. In some examples, the moldable material can include polymeric materials, glass materials, ceramic materials, or combinations thereof. In some examples, the moldable material can include a flowable material and can be made to flow or move at least partially into the pores and/or cavities of the part as described herein. In some examples, the moldable material can include a material capable of changing or transitioning between a flowable state and a substantially solid, or non-flowable state, for example, by cooling, curing, or any other process or technique.

Any of the features or aspects of the components discussed herein can be combined or included in any varied combination. For example, the design and shape of the exterior or first portion and the interior or second portion is not limited in any way and can be formed by any number of processes, including those discussed herein. Further, a first portion can be joined with a second portion at any time and by any known method, even during formation of one or both portions. A component, as discussed herein, can be or can form all or a portion of a component, such as a housing or enclosure, for an electronic device. The component can also be or form any number of additional components of an electronic device, including internal components, external components, cases, surfaces, or partial surfaces.

As used herein, the terms exterior, outer, interior, and inner are used for reference purposes only. An exterior or outer portion of a component can form a portion of an exterior surface of the component, but may not necessarily form the entire exterior of outer surface thereof. Similarly, the interior or inner portion of a component can form or define an interior or inner portion of the component, but can also form or define a portion of an exterior or outer surface of the component.

Various inventions have been described herein with reference to certain specific embodiments and examples. However, they will be recognized by those skilled in the art that many variations are possible without departing from the scope and spirit of the inventions disclosed herein, in that those inventions set forth in the claims below are intended to cover all variations and modifications of the inventions disclosed without departing from the spirit of the inventions. The terms "including:" and "having" come as used in the specification and claims shall have the same meaning as the term "comprising."

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

What is claimed is:

1. A housing for an electronic device, comprising:
a first housing portion, comprising:
a first substrate comprising a first metal and at least partially defining an exterior surface of the housing; and
a first additively manufactured portion bonded to the first substrate, the first additively manufactured portion comprising a second metal and defining a first engagement structure;
a second housing portion, comprising:
a second substrate comprising a third metal and at least partially defining the exterior surface; and
a second additively manufactured portion bonded to the second substrate, the second additively manufactured portion comprising a fourth metal and defining a second engagement structure; and
a material engaging the first substrate, the first engagement structure, the second substrate, and the second engagement structure.

2. The housing of claim 1, wherein the first metal is different from the second metal.

3. The housing of claim 1, wherein at least one of the first metal and the second metal comprises at least one of steel or titanium.

4. The housing of claim 3, wherein the second metal comprises at least one of steel, aluminum, or copper.

5. The housing of claim 1, wherein:
the first substrate has a first density;
the second substrate has a second density;
the first additively manufactured portion has a third density that is lower than the first density; and
the second additively manufactured portion has a fourth density that is lower than the second density.

6. The housing of claim 1, wherein at least one of the first engagement structure or the second engagement structure comprises a gyroid structure.

7. The housing of claim 1, wherein at least one of the first engagement structure or the second engagement structure defines an array of fluidically interconnected voids.

8. The housing of claim 1, wherein the material comprises a polymer.

9. A component for an electronic device, comprising:
a pre-formed substrate comprising a first metal; and
an additively manufactured portion bonded to the pre-formed substrate, the additively manufactured portion comprising:
a first portion comprising a second metal and defining a volume, the first portion having a first value of a material property; and
a second portion disposed in the volume, the second portion having a second value of the material property that is different from the first value;
wherein the first portion at least partially surrounds the second portion.

10. The component of claim 9, wherein the material property comprises density and the second value is lower than the first value.

11. The component of claim 9, wherein the material property comprises thermal conductivity and the second value is higher than the first value.

12. The component of claim 9, wherein the second portion comprises an electronic component.

13. The component of claim 9, wherein the second portion comprises a self-healing material.

14. The component of claim 9, wherein the first metal is different from the second metal.

15. The component of claim 9, wherein the pre-formed substrate defines a cosmetic exterior surface of the electronic device.

16. The component of claim 9, wherein the additively manufactured portion is diffusion bonded to the pre-formed substrate.

* * * * *